US012380850B2
US 12,380,850 B2
Aug. 5, 2025

(12) United States Patent
Jang et al.

(54) DISPLAY DEVICE

(71) Applicant: Samsung Display Co., LTD., Yongin-si (KR)

(72) Inventors: Jae Yong Jang, Yongin-si (KR); Bon Yong Koo, Yongin-si (KR); Hyun Joon Kim, Yongin-si (KR); Dan Won Lim, Yongin-si (KR); Seon Young Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/543,347

(22) Filed: Dec. 18, 2023

(65) Prior Publication Data

US 2024/0355281 A1 Oct. 24, 2024

(30) Foreign Application Priority Data

Apr. 24, 2023 (KR) .................. 10-2023-0053308

(51) Int. Cl.
*G09G 3/3233* (2016.01)
*H10K 59/122* (2023.01)
(Continued)

(52) U.S. Cl.
CPC ......... *G09G 3/3233* (2013.01); *H10K 59/122* (2023.02); *H10K 59/131* (2023.02);
(Continued)

(58) Field of Classification Search
CPC ............... G09G 3/3233; G09G 3/3266; G09G 2310/0283; G09G 2330/021;
(Continued)

(56) References Cited

U.S. PATENT DOCUMENTS 11,164,514 B2 11/2021 Cho et al.
11,557,236 B2 * 1/2023 Jeong ................. H04N 9/30
(Continued)

FOREIGN PATENT DOCUMENTS

CN 110265468 9/2019
EP 3 896 741 10/2021
(Continued)

OTHER PUBLICATIONS

Extended European Search Report for European Application No. 24166158.6, dated Sep. 23, 2024.

*Primary Examiner* — David Tung
(74) *Attorney, Agent, or Firm* — KILE PARK REED & HOUTTEMAN PLLC

(57) ABSTRACT

Provided is a display device including a substrate, a circuit layer disposed on a first surface of the substrate, a light emitting element layer, and a circuit board disposed on a second surface of the substrate. The circuit layer includes pixel drivers, gate lines, a first power supply line and a second power supply line respectively transmitting a first power and a second power, and a gate driver including stages electrically connected to the gate lines, respectively. The second power supply line is electrically connected to the circuit board through power connection portions. The power connection portions are disposed between a number of the stages adjacent to a curved corner of the substrate among the stages of the gate driver.

27 Claims, 21 Drawing Sheets

(51) Int. Cl.
  *H10K 59/131* (2023.01)
  *H10K 77/10* (2023.01)
  *H10K 102/00* (2023.01)
(52) U.S. Cl.
  CPC ... *H10K 77/111* (2023.02); *G09G 2310/0283* (2013.01); *G09G 2330/021* (2013.01); *H10K 2102/311* (2023.02)
(58) Field of Classification Search
  CPC .. H10K 59/122; H10K 59/131; H10K 77/111; H10K 2102/311
  See application file for complete search history.

(56) References Cited

U.S. PATENT DOCUMENTS

| 2014/0139771 | A1* | 5/2014 | Choi | H10K 59/131 |
| | | | | 349/43 |
| 2015/0036300 | A1* | 2/2015 | Park | H05K 1/14 |
| | | | | 156/212 |
| 2017/0186349 | A1* | 6/2017 | Arima | G09G 3/2085 |
| 2017/0288002 | A1* | 10/2017 | Kim | H10K 59/121 |
| 2018/0158895 | A1* | 6/2018 | Lee | H10K 59/124 |
| 2020/0135821 | A1* | 4/2020 | Seo | H05K 1/144 |
| 2021/0026423 | A1* | 1/2021 | Choi | H10K 77/111 |
| 2021/0142718 | A1* | 5/2021 | Lee | G09G 3/32 |
| 2021/0217779 | A1 | 7/2021 | Yoshida | |
| 2021/0327995 | A1 | 10/2021 | Yao et al. | |
| 2021/0408211 | A1 | 12/2021 | Lim et al. | |

FOREIGN PATENT DOCUMENTS

| EP | 3 979 326 | 4/2022 |
| KR | 10-2022-0068302 | 5/2022 |
| KR | 10-2023-0134016 | 9/2023 |

\* cited by examiner

GL : GWL, GIL, ECL, GCL
GDR : GDRI, GDRI2, GDRI3
STG' : WRSTG', INSTG', EMSTG'
GDR1 : WRSTG'
GDR2 : INSTG'
GDR3 : EMSTG'

GL : GWL, GIL, ECL, GCL
GDR : GDRI, GDRI2, GDRI3
STG' : WRSTG', INSTG', EMSTG'
GDR1 : WRSTG'
GDR2 : INSTG'
GDR3 : EMSTG'

DISPLAY DEVICE

CROSS-REFERENCE TO RELATED APPLICATION(S)

This application claims priority to and benefits of Korean Patent Application No. 10-2023-0053308 under 35 U.S.C. § 119 filed on Apr. 24, 2023, in the Korean Intellectual Property Office, the entire contents of which are incorporated herein by reference.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions.

At least one surface of the display device may be a display surface on which an image is displayed. The display surface may include a display area in which emission areas for image display are arranged, and a non-display area disposed around the display area.

The display device may include a circuit board and a display driving circuit for supplying a power or various signals for individually driving emission areas of the display area to a display panel. The circuit board may be electrically connected to the display panel while being connected to signal pads of the display panel. Further, the display driving circuit may be mounted on the non-display area or the circuit board.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The signal pads to which the circuit board is connected may be disposed on one side of the non-display area. The width of one side of the non-display area needs to be greater than the sum of the total width of the signal pads and the width of the circuit board, so that the ratio of the width allocated to the display area on the display surface of the display device is reduced, which may deteriorate the display quality of the display device.

To solve this problem, the display device may further include a sub-region protruding from one side of the non-display area and in which signal pads are disposed, and a bending area that is disposed at a boundary between the sub-region and the non-display area and transformed to be bent. Due to the bending area, the sub-region and the circuit board are disposed on the rear surface opposite to the display surface, so that the influence of the signal pads and the circuit board on the width of the non-display area may be reduced. Since, however, bending lines extending between the non-display area and the sub-region are disposed in the bending area, the curvature of the bending area transformed to be bent needs to be limited to a threshold or a higher level at which a defect in which the bending lines are disconnected or short-circuited may be prevented. Accordingly, due to the width of the bending area, there is a limitation in increasing the ratio of the width allocated to the display area on the display surface of the display device.

In view of the above, aspects of the disclosure provide a display device in which a bending area is not included and a circuit board may be disposed on a rear surface.

Aspects of the disclosure also provide a display device capable of reducing the width of a non-display area without reducing the number of signal pads.

According to an aspect of the disclosure, there is provided a display device that may include a substrate comprising a display area including emission areas and a non-display area adjacent to the display area; a circuit layer disposed on a first surface of the substrate; a light emitting element layer disposed on the circuit layer and comprising light emitting elements respectively corresponding to the emission areas; and a circuit board disposed on a second surface of the substrate opposite to the first surface. The circuit layer comprises pixel drivers respectively corresponding to the emission areas and electrically connected to the light emitting elements of the light emitting element layer; gate lines extending in a first direction and transmitting gate signals to the pixel drivers; a first power supply line and a second power supply line disposed in the non-display area and respectively transmitting a first power and a second power that drive the light emitting elements; and a gate driver disposed between an edge of the substrate and at least one side in the first direction of the display area in the non-display area, and comprising stages electrically connected to the gate lines, respectively. The second power supply line is electrically connected to the circuit board through power connection portions. The power connection portions are disposed between a number of the stages adjacent to a curved corner of the substrate among the stages of the gate driver.

The gate driver may comprise stage groups which are part of the stages. A gap between the stage groups is greater than a gap between two or more consecutive stages. The power connection portions are disposed between a number of the stage groups of the gate driver adjacent to the curved corner of the substrate.

The circuit layer may have a structure comprising a buffer layer disposed on the substrate; a semiconductor layer disposed on the buffer layer; a first gate insulating layer covering the semiconductor layer; a first gate conductive layer disposed on the first gate insulating layer; a second gate insulating layer covering the first gate conductive layer; a second gate conductive layer disposed on the second gate insulating layer; an interlayer insulating layer covering the second gate conductive layer; a first source-drain conductive layer disposed on the interlayer insulating layer; a first planarization layer covering the first source-drain conductive layer; a second source-drain conductive layer disposed on the first planarization layer; and a second planarization layer covering the second source-drain conductive layer. The second source-drain conductive layer comprises the second power supply line.

The substrate may comprise a first support layer comprising the second surface of the substrate; a first barrier layer disposed on a surface of the first support layer opposite to the second surface; a pad conductive layer disposed on a part of the first barrier layer; a second barrier layer covering the pad conductive layer; and a second support layer disposed on the second barrier layer and comprising a surface facing the first support layer and the first surface of the substrate. The pad conductive layer comprises signal pads electrically connected to the circuit board, and pad lines respectively electrically connected to the signal pads. The second power supply line is electrically connected to a second power pad line among the pad lines through the power connection portions. The circuit board is electrically connected to the signal pads through a pad hole penetrating the first support layer, and is electrically connected to the second power pad line through a second power signal pad electrically connected to the second power pad line among the signal pads.

Each of the power connection portions may comprise a first through hole penetrating the first planarization layer; a second through hole penetrating the interlayer insulating layer, the second gate insulating layer, the first gate insulating layer, and the buffer layer; a third through hole penetrating the second support layer and the second barrier layer, and a second power supply connection electrode electrically connected to the second power supply line through the first through hole, and electrically connected to the second power pad line through the second through hole and the third through hole.

The gate lines may comprise a scan write line that transmits a scan write signal to the pixel drivers; a scan initialization line that transmits a scan initialization signal to the pixel drivers; an emission control line that transmits an emission control signal to the pixel drivers; and a gate control line that transmits a gate control signal to the pixel drivers. The circuit layer further comprises a data line that transmits a data signal to the pixel drivers; an initialization voltage line that transmits an initialization voltage to the pixel drivers; and a first power line electrically connected between the first power supply line and the pixel drivers. One of the pixel drivers of the circuit layer is electrically connected to at least one of the light emitting elements of the light emitting element layer. The one pixel driver comprises a driving transistor that generates a driving current that drives the at least one light emitting element; a first transistor disposed between a gate electrode of the driving transistor and a second electrode of the driving transistor, and turned on based on the scan write signal of the scan write line; a second transistor disposed between the data line and a first electrode of the driving transistor, and turned on based on the scan write signal of the scan write line; a third transistor disposed between the initialization voltage line and the gate electrode of the driving transistor, and turned on based on the scan initialization signal of the scan initialization line; a fourth transistor disposed between the initialization voltage line and the at least one light emitting element, and turned on based on the scan initialization signal of the scan initialization line; a fifth transistor disposed between the first power supply line and the first electrode of the driving transistor, and turned on based on the emission control signal of the emission control line; and a sixth transistor disposed between the second electrode of the driving transistor and the at least one light emitting element, and turned on based on the emission control signal of the emission control line.

The gate driver may comprise a first gate driver, a second gate driver, and a third gate driver disposed side by side in the first direction between a side of the display area in the first direction and the edge of the substrate. The first gate driver comprises write stages electrically connected to the scan write line. The second gate driver comprises initialization stages electrically connected to the scan initialization line and the gate control line. The third gate driver comprises emission stages electrically connected to the emission control line.

The third gate driver may comprise emission stage groups which are part of the emission stages. A gap between the emission stage groups is greater than a gap between two or more consecutive emission stages. The second power supply line overlaps the third gate driver. The power connection portions are disposed between a number of the emission stage groups of the third gate driver adjacent to the curved corner of the substrate.

The first gate driver may comprise write stage groups which are part of the write stages. A gap between the write stage groups is greater than a gap between two or more consecutive write stages. The circuit layer further comprises a power supply additional line overlapping a part of the first gate driver. The power supply additional line is electrically connected to the second power pad line through second power additional connection portions. The second power additional connection portions are disposed between a number of the write stage groups of the first gate driver adjacent to the curved corner of the substrate.

The circuit layer may further comprise gate control supply lines, gate voltage supply lines, and gate clock supply lines electrically connected to the stages of the gate driver. The gate control supply lines transmit gate driving control signals to the stages. The gate voltage supply lines transmit gate level voltages for generating the gate signals. The gate clock supply lines transmit clock signals for generating the gate signals. Each of the gate control supply lines, the gate voltage supply lines, and the gate clock supply lines is included in the first source-drain conductive layer or the second source-drain conductive layer, and spaced apart from the power connection portions. The gate voltage supply lines comprise a first gate voltage supply line adjacent to or overlapping the first gate driver, and supplying a first gate level voltage, a second gate voltage supply line adjacent to or overlapping the first gate driver, and supplying a second gate level voltage different from the first gate level voltage, a third gate voltage supply line overlapping the second gate driver, and supplying a third gate level voltage different from the first gate level voltage and the second gate level voltage, a fourth gate voltage supply line overlapping the second gate driver, and supplying a fourth gate level voltage different from the first gate level voltage, the second gate level voltage, and the third gate level voltage, and a fifth gate voltage supply line overlapping at least a part of the fourth gate voltage supply line, and supplying the first gate level voltage. The third gate voltage supply line is electrically connected to the circuit board through a third gate voltage connection portion. The fourth gate voltage supply line is electrically connected to the circuit board through a fourth gate voltage connection portion. The second gate driver comprises initialization stage groups which are part of the initialization stages. A gap between the initialization stage groups is greater than a gap between two or more consecutive initialization stages. The third gate voltage connection portion and the fourth gate voltage connection portion are disposed between a number of the initialization stage groups of the second gate driver adjacent to the curved corner of the substrate.

The gate control supply lines may comprise a first gate control supply line that transmits an input carry signal to the write stages of the first gate driver, a second gate control supply line that transmits an input carry signal to the initialization stages of the second gate driver, a third gate control supply line that transmits a start signal of the first gate driver, a fourth gate control supply line that transmits a start signal of the second gate driver, a fifth gate control supply line that transmits a start signal of the third gate driver, a sixth gate control supply line that transmits a gate-on signal, and a seventh gate control supply line that transmits an input carry signal to the emission stages of the third gate driver. The fifth gate voltage supply line is spaced apart from each of the third gate voltage supply line and the fourth gate voltage supply line between a number of the initialization stage groups of the second gate driver adjacent to the curved corner of the substrate.

The third gate control supply line, the fourth gate control supply line, and the fifth gate control supply line may overlap the second gate driver.

The third gate control supply line, the fourth gate control supply line, and the fifth gate control supply line may overlap the first gate driver.

According to an aspect of the disclosure, there is provided a display device that may include a substrate comprising a display area including emission areas and a non-display area adjacent to the display area; a circuit layer disposed on a first surface of the substrate; a light emitting element layer disposed on the circuit layer and comprising light emitting elements respectively corresponding to the emission areas; and a circuit board disposed on a second surface of the substrate opposite to the first surface. The substrate comprises a first support layer and a second support layer facing each other, and a pad conductive layer disposed between the first support layer and the second support layer. The pad conductive layer comprises signal pads electrically connected to the circuit board, and pad lines respectively electrically connected to the signal pads. The circuit layer comprises pixel drivers respectively corresponding to the emission areas and electrically connected to the light emitting elements of the light emitting element layer, gate lines extending in a first direction and transmitting gate signals to the pixel drivers, a first power supply line and a second power supply line disposed in the non-display area and respectively transmitting a first power and a second power that drive the light emitting elements, and a gate driver disposed between an edge of the substrate and at least a side in the first direction of the display area in the non-display area, and comprising stages electrically connected to the gate lines, respectively. The second power supply line is electrically connected to a second power pad line among the pad lines through power connection portions. The power connection portions are disposed between a number of the stages adjacent to a curved corner of the substrate among the stages of the gate driver.

The gate driver may comprise stage groups which are part of the stages. A gap between the stage groups is greater than a gap between two or more consecutive stages. The second power connection portions are disposed between a number of the stage groups of the gate driver adjacent to the curved corner of the substrate.

The second support layer may comprise the first surface of the substrate. The first support layer comprises the second surface of the substrate. The substrate further comprises a first barrier layer disposed on a surface of the first support layer opposite to the second surface, and a second barrier layer disposed on a surface of the second support layer opposite to the first surface. The pad lines are disposed between the first barrier layer and the second barrier layer. The signal pads are disposed between the second barrier layer and the first support layer. The circuit board is electrically connected to the signal pads through a pad hole penetrating the first support layer.

The circuit layer may have a structure comprising a buffer layer disposed on the substrate, a semiconductor layer disposed on the buffer layer, a first gate insulating layer covering the semiconductor layer, a first gate conductive layer disposed on the first gate insulating layer, a second gate insulating layer covering the first gate conductive layer, a second gate conductive layer disposed on the second gate insulating layer, an interlayer insulating layer covering the second gate conductive layer, a first source-drain conductive layer disposed on the interlayer insulating layer, a first planarization layer covering the first source-drain conductive layer, a second source-drain conductive layer disposed on the first planarization layer, and a second planarization layer covering the second source-drain conductive layer. The second source-drain conductive layer comprises the second power supply line.

Each of the power connection portions may comprise a first through hole penetrating the first planarization layer, a second through hole penetrating the interlayer insulating layer, the second gate insulating layer, the first gate insulating layer, and the buffer layer, a third through hole penetrating the second support layer and the second barrier layer, and a second power supply connection electrode electrically connected to the second power supply line through the first through hole, and electrically connected to the second power pad line through the second through hole and the third through hole.

The circuit layer may further comprise gate control supply lines, gate voltage supply lines, and gate clock supply lines electrically connected to the stages of the gate driver. The gate control supply lines transmit gate driving control signals to the stages. The gate voltage supply lines transmit level voltages of the gate signal. The gate clock supply lines transmit clock signals for generating the gate signal. The gate control supply lines, the gate voltage supply lines, and the gate clock supply lines are included in the first source-drain conductive layer or the second source-drain conductive layer, and spaced apart from the second power connection portions. A number of the gate control supply lines, the gate voltage supply lines, and the gate clock supply lines adjacent to the power connection portions overlap the second power supply line.

The gate lines may comprise a scan write line that transmits a scan write signal to the pixel drivers, a scan initialization line that transmits a scan initialization signal to the pixel drivers, an emission control line that transmits an emission control signal to the pixel drivers, and a gate control line that transmits a gate control signal to the pixel drivers. The circuit layer further comprises a data line that transmits a data signal to the pixel drivers, an initialization voltage line that transmits an initialization voltage to the pixel drivers, and a first power line electrically connected between the first power supply line and the pixel drivers. One of the pixel drivers of the circuit layer is electrically connected to at least one of the light emitting elements of the light emitting element layer. The one pixel driver comprises a driving transistor that generates a driving current that drives the at least one light emitting element, a first transistor disposed between a gate electrode of the driving transistor and a second electrode of the driving transistor, and turned on based on the scan write signal of the scan write line, a second transistor disposed between the data line and a first electrode of the driving transistor, and turned on based on the scan write signal of the scan write line, a third transistor disposed between the initialization voltage line and the gate electrode of the driving transistor, and turned on based on the scan initialization signal of the scan initialization line, a fourth transistor disposed between the initialization voltage line and the at least one light emitting element, and turned on based on the scan initialization signal of the scan initialization line, a fifth transistor disposed between the first power supply line and the first electrode of the driving transistor, and turned on based on the emission control signal of the emission control line, and a sixth transistor disposed between the second electrode of the driving transistor and the at least one light emitting element, and turned on based on the emission control signal of the emission control line.

The gate driver may comprise a first gate driver, a second gate driver, and a third gate driver disposed side by side in the first direction between a side of the display area in the first direction and the edge of the substrate. The first gate driver comprises write stages electrically connected to the scan write line. The second gate driver comprises initialization stages electrically connected to the scan initialization line and the gate control line. The third gate driver comprises emission stages electrically connected to the emission control line.

The third gate driver may comprise emission stage groups which are part of the emission stages. A gap between the emission stage groups is greater than a gap between two or more consecutive emission stages. The second power supply line overlaps the third gate driver. The power connection portions are disposed between a number of the emission stage groups of the third gate driver adjacent to the curved corner of the substrate.

The circuit layer may further comprise gate control supply lines, gate voltage supply lines, and gate clock supply lines electrically connected to the stages of the gate driver. The gate control supply lines transmit gate driving control signals to the stages. The gate voltage supply lines transmit level voltages of the gate signal. The gate clock supply lines transmit clock signals for generating the gate signal. The gate control supply lines comprise a first gate control supply line that transmits an input carry signal to the write stages of the first gate driver, a second gate control supply line that transmits an input carry signal to the initialization stages of the second gate driver, a third gate control supply line that transmits a start signal of the first gate driver, a fourth gate control supply line that transmits a start signal of the second gate driver, a fifth gate control supply line that transmits a start signal of the third gate driver, a sixth gate control supply line that transmits a gate-on signal to the second gate driver and the third gate driver, and a seventh gate control supply line that transmits an input carry signal to the emission stages of the third gate driver.

The first gate driver may comprise write stage groups which are part of the write stages. A gap between the write stage groups is greater than a gap between two or more consecutive write stages. The circuit layer further comprises a second power supply additional line electrically connected to the second power pad line through second power additional connection portions. The third gate control supply line, the fourth gate control supply line, and the fifth gate control supply line overlap the second gate driver. The second power additional connection portions are disposed between a number of the write stage groups of the first gate driver adjacent to the curved corner of the substrate.

The gate voltage supply lines may comprise a first gate voltage supply line disposed adjacent to or overlapping the first gate driver, and supplying a first gate level voltage, a second gate voltage supply line disposed adjacent to or overlapping the first gate driver, and supplying a second gate level voltage different from the first gate level voltage, a third gate voltage supply line overlapping the second gate driver, and supplying a third gate level voltage different from the first gate level voltage and the second gate level voltage, a fourth gate voltage supply line overlapping the second gate driver, and supplying a fourth gate level voltage different from the first gate level voltage, the second gate level voltage, and the third gate level voltage, and a fifth gate voltage supply line overlapping at least a part of the fourth gate voltage supply line, and supplying the first gate level voltage. The third gate voltage supply line is electrically connected to the circuit board through a third gate voltage connection portion. The fourth gate voltage supply line is electrically connected to the circuit board through a fourth gate voltage connection portion. The second gate driver comprises initialization stage groups which are part of the initialization stages. A gap between the initialization stage groups is greater than a gap between two or more consecutive initialization stages. The third gate voltage connection portion and the fourth gate voltage connection portion are disposed between a number of the initialization stage groups of the second gate driver adjacent to the curved corner of the substrate.

The third gate control supply line, the fourth gate control supply line, and the fifth gate control supply line may overlap the second gate driver.

The third gate control supply line, the fourth gate control supply line, and the fifth gate control supply line may overlap the first gate driver.

A display device according to one embodiment may include a circuit layer disposed on a first surface of a substrate, and a circuit board disposed on a second surface of the substrate.

The circuit layer may include a first power supply line and a second power supply line disposed in the non-display area and respectively transmitting a first power and a second power that drive a light emitting element, and a gate driver disposed in the non-display area and including stages electrically connected to gate lines of the display area.

The second power supply line may be electrically connected to the circuit board through power connection portions. For example, the second power supply line may be electrically connected to a second power pad line formed of a part of a pad conductive layer of the substrate through the power line connection portions, and the circuit board may be electrically connected to a second power pad connected to the second power pad line, so that the second power supply line of the circuit layer may be electrically connected to the circuit board.

The power connection portions may be disposed between a number of stages adjacent to the curved corner of the substrate among the stages of the gate driver.

In this way, the power connection portions may not be separately disposed in a number of regions of the non-display area, but are disposed between the stages of the gate driver disposed in the non-display area, so that a partial width of the non-display area may not be allocated to the arrangement of the power connection portions. Accordingly, the width of the non-display area may be reduced.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
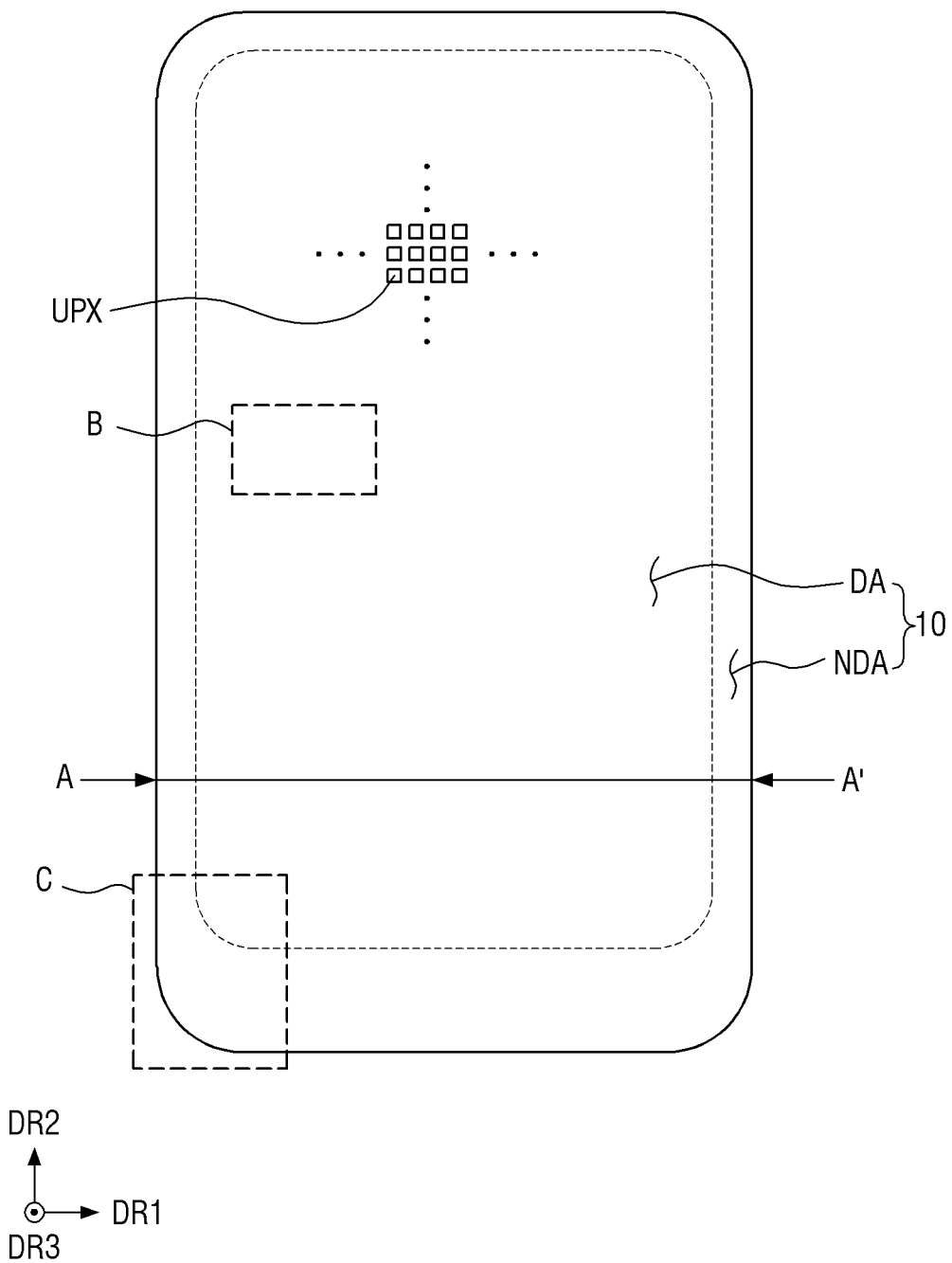
FIG. 1 is a schematic plan view illustrating a display surface of a display device according to one embodiment.

Embodiments of the disclosure will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts that are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and/or vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the disclosure herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As used herein, the singular forms, "a," "an," and "the" are intended to include the plural forms as well, unless the context clearly indicates otherwise.

Unless otherwise defined or implied, all terms used herein (including technical and scientific terms) have the same meaning as commonly understood by those skilled in the art to which the disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

FIG. 1 is a schematic plan view illustrating a display surface of a display device according to one embodiment.

Referring to FIG. 1, a display device 10 is a device for displaying a moving image or a still image. The display device 10 may be used as a display screen of various devices, such as a television, a laptop computer, a monitor, a billboard and an Internet-of-Things (IoT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be a light emitting display device such as an organic light emitting display using an organic light emitting diode, a quantum dot light emitting display including a quantum dot light emitting layer, an inorganic light emitting display including an inorganic semiconductor, and a micro light emitting display using a micro or nano light emitting diode (LED). In the following description, it is assumed that the display device 10 is an organic light emitting display device. However, the disclosure is not limited thereto, and may be applied to a display device including an organic insulating material, an organic light emitting material, and a metal material.

The display device 10 may be formed to be flat, but is not limited thereto. For example, the display device 10 may include a curved portion formed at left and right ends and having a constant curvature or a varying curvature. The display device 10 may be formed flexibly so that it can be curved, bent, folded, or rolled.

At least one surface (or a surface) of the display device 10 may be a display surface on which image display is implemented.

The display surface of the display device 10 may include a display area DA in which unit pixels UPX for displaying an image are arranged (or disposed), and a non-display area NDA that is a peripheral area of the display area DA.

The unit pixels UPX may be arranged in the display area DA in a first direction DR1 or a second direction DR2. The unit pixels UPX may be a minimum unit displaying light of various colors with respective luminances. Each of the unit pixels UPX may include two or more emission areas EA (see FIG. 3) adjacent to each other.

To provide the unit pixels UPX, the emission areas EA may be arranged in the display area DA.

The emission areas EA may be a minimum unit displaying light of a specific color with respective luminances.

The display area DA may, in plan view, be formed in a rectangular shape having short sides in a first direction DR1 and long sides in a second direction DR2 intersecting the first direction DR1. The corner where the short side in the first direction DR1 and the long side in the second direction DR2 meet may be rounded to have a selectable curvature or may be right-angled. The planar shape of the display area DA is not limited to the rectangular shape, and may be formed in another polygonal shape, a circular shape or an elliptical shape.

The display area DA may occupy most of the display surface. The display area DA may be disposed at the center of the display surface.

The non-display area NDA may be disposed around the display area DA. For example, the display area DA may be surrounded by (or adjacent to) the non-display area NDA.

Figure 2:
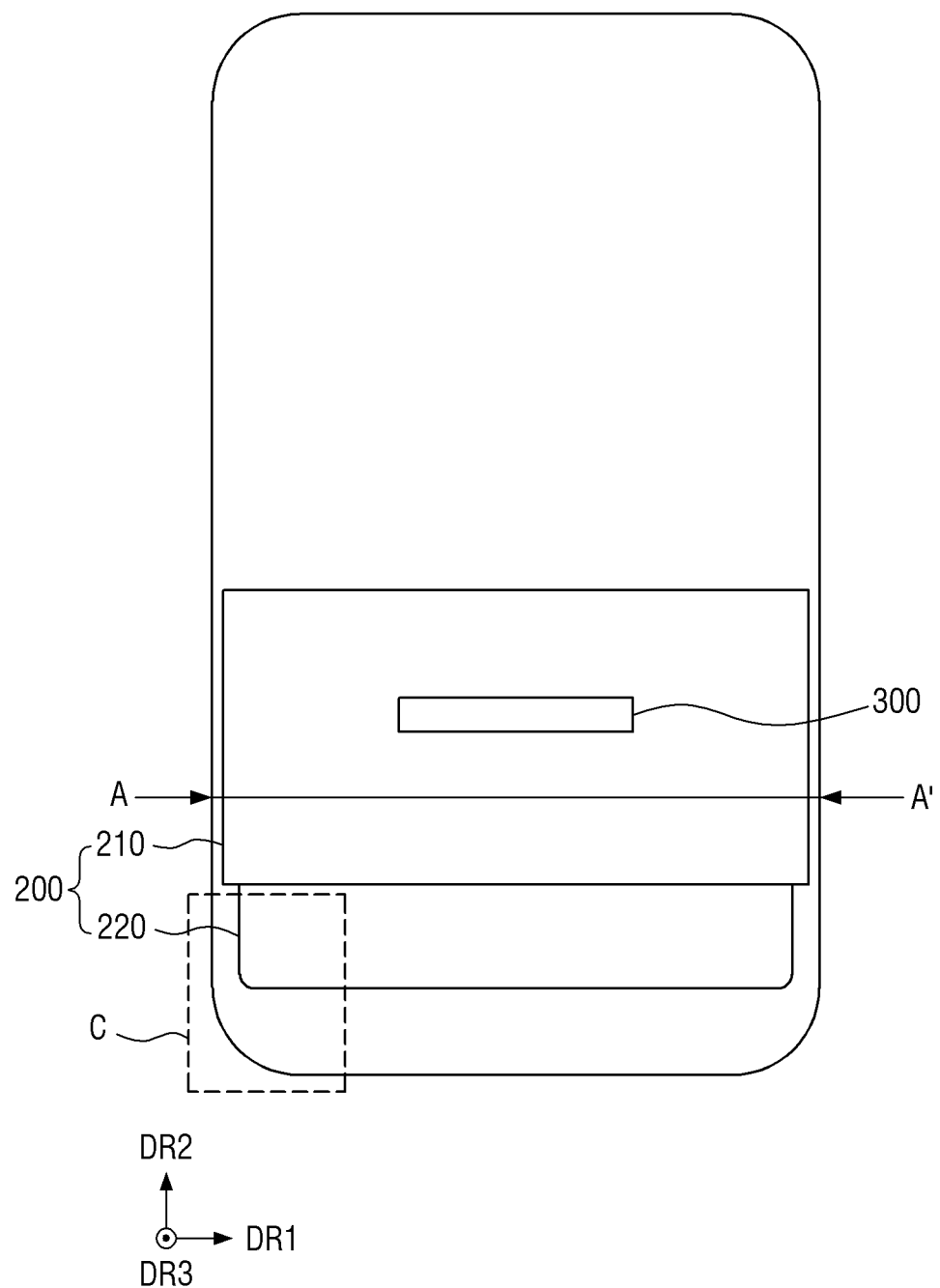
FIG. 2 is a schematic plan view illustrating a rear surface opposite to a display surface of a display device according to one embodiment.

FIG. 2 is a schematic plan view illustrating a rear surface opposite to a display surface of a display device according to one embodiment.

Referring to FIG. 2, the display device 10 according to one embodiment may further include a circuit board 200 disposed on the rear surface opposite to the display surface and a display driving circuit 300 mounted on the circuit board 200.

The circuit board 200 may include a main board portion 210, and a flexible board portion 220 that electrically connects the main board portion 210 and signal pads SPD (see FIG. 12) disposed on the rear surface of the display device 10.

Figure 13:
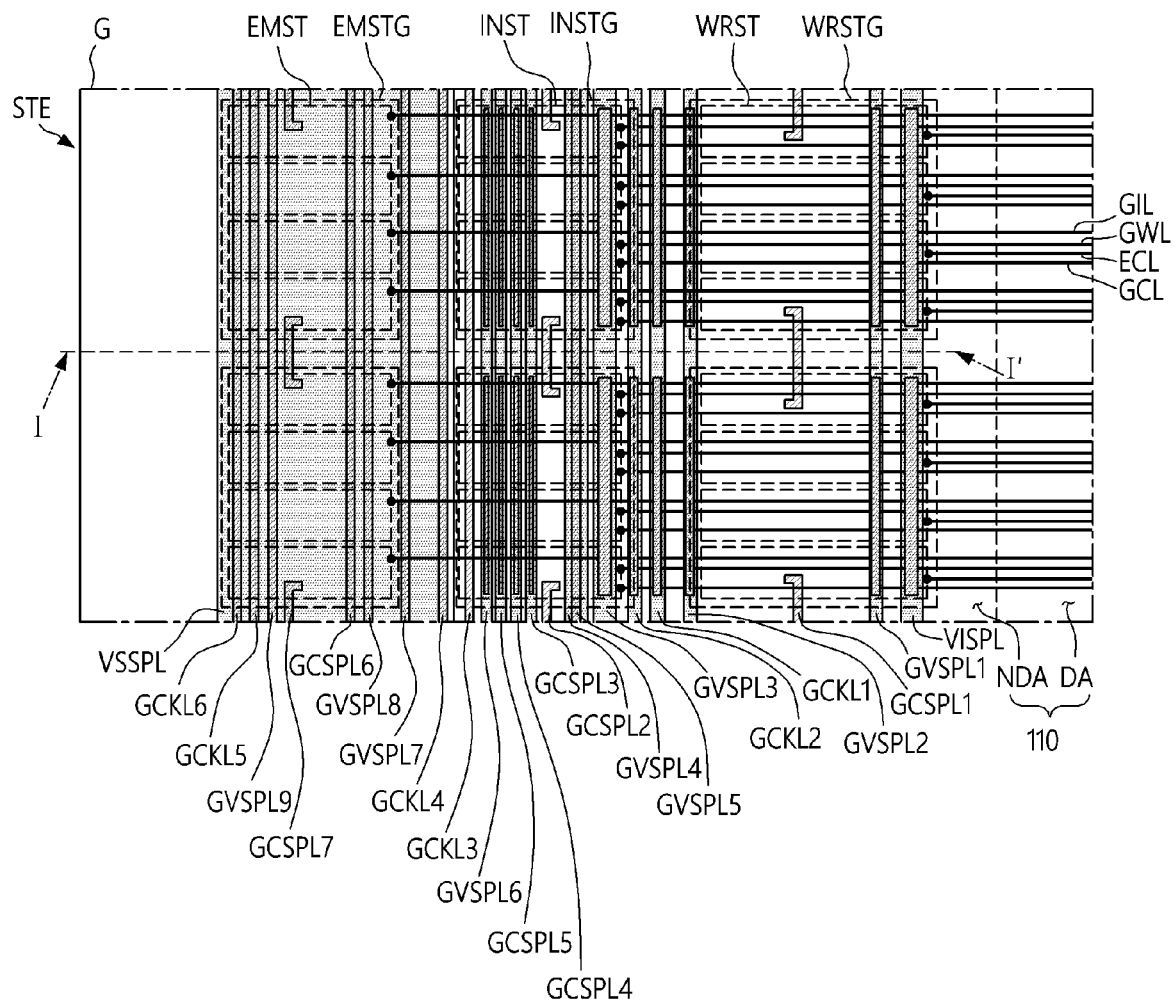
FIG. 13 is a schematic plan diagram illustrating part G of FIG. 9.

The flexible board portion 220 may be bonded to the signal pads SPD by a separate conductive adhesive member 230 (see FIG. 13).

The display driving circuit 300 may be provided as an integrated circuit (IC), and may be mounted on the main substrate 210.

The display driving circuit 300 may supply a data signal of each of the data lines DL (see FIG. 9) of the circuit layer 120 (see FIG. 3) disposed in the display area DA of the display surface.

However, the illustration in FIG. 2 is an example, and the circuit board 200 may be formed of a flexible single component, or the display driving circuit 300 may be disposed on the flexible board portion 220. By way of example, the display driving circuit 300 may be embedded in the circuit board 200 without being provided as a separate IC chip.

Figure 3:
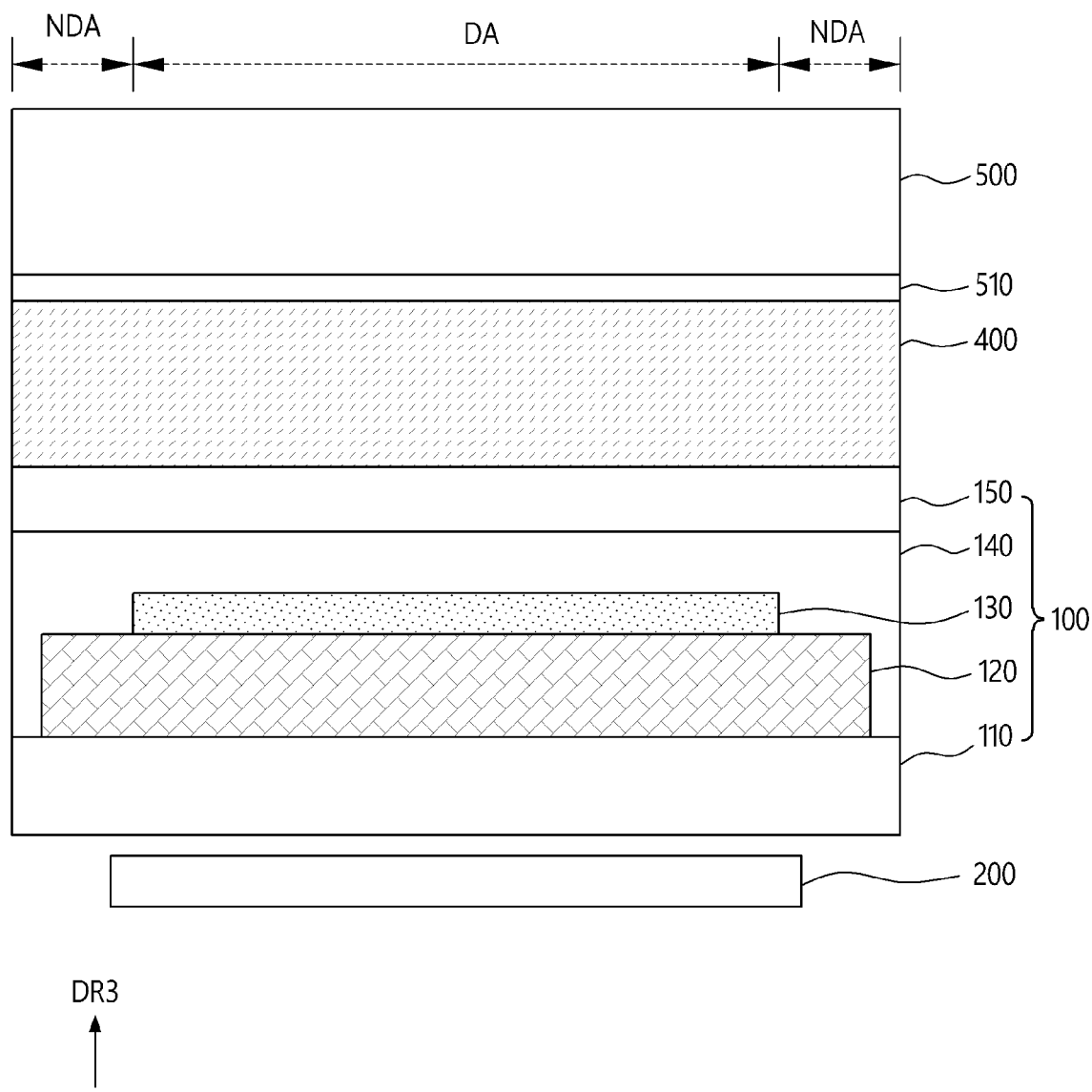
FIG. 3 is a schematic cross-sectional view taken along line A-A' of FIGS. 1 and 2.

FIG. 3 is a schematic cross-sectional view taken along line A-A' of FIGS. 1 and 2.

Referring to FIG. 3, the display device 10 according to one embodiment may include the display panel 100 including the display area DA and the non-display area NDA, a polarizing member 400 disposed on the display panel 100, and a cover member 500 disposed on the polarizing member 400.

The polarizing member 400 may polarize external light directed toward the display panel 100 and light emitted from the display panel 100. The display quality deterioration caused by external light reflection may be suppressed by the polarizing member 400.

The cover member 500 may be formed of a high-strength glass material. The cover member 500 may be fixed on the polarizing member 400 by a transparent adhesive member 510 such as an optically clear adhesive (OCA) film or an optically clear resin (OCR).

The display panel 100 of the display device 10 according to one embodiment may include the substrate 110, the circuit layer 120, a light emitting element layer 130, and an encapsulation layer 140.

The substrate 110 may include the display area DA in which the emission areas EA (see FIG. 3) are arranged and the non-display area NDA.

The substrate 110 may be formed of an insulating material such as a polymer resin. For example, the substrate 110 may be formed of polyimide. The substrate 110 may be a flexible substrate which can be bent, folded or rolled.

In accordance with one embodiment, the substrate 110 may have a multi-layer structure including a conductive layer.

The circuit layer 120 is disposed on the first surface of the substrate 110. The first surface of the substrate 110 may correspond to the display surface of the display device 10.

Figure 9:
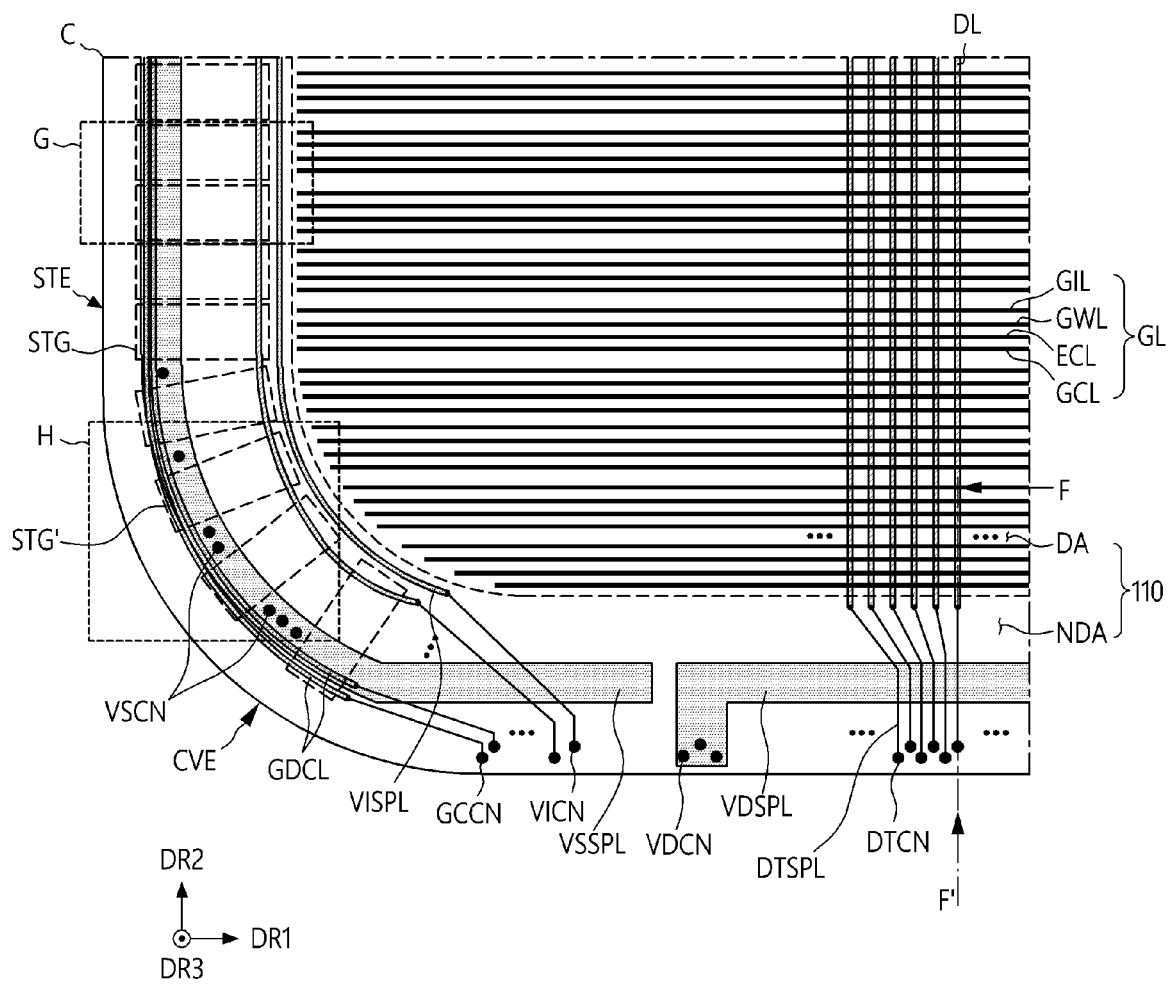
FIG. 9 is a schematic plan diagram illustrating part C of FIG. 1.

The circuit layer 120 may include pixel driver PXD (see FIG. 5) respectively corresponding to the emission areas EA, and gate lines (GL in FIG. 9; GWL, GIL, GCL, and ECL in FIG. 5) extending in the first direction DR1 and transmitting gate signals GW, GI, GC, and EM (see FIG. 5) to the pixel drivers PXD.

The circuit layer 120 further may include a first power supply line VDSPL (see FIG. 9), a second power supply line VSSPL (see FIG. 9), and a gate driver GDR (see FIG. 9) that are disposed in the non-display area NDA.

The first power supply line VDSPL and the second power supply line VSSPL respectively transmit a first power ELVDD (see FIG. 5) and a second power ELVSS (scc FIG. 5) for driving light emitting elements LEL of the light emitting element layer 130.

The gate driver GDR may be disposed between the edge of the substrate 110 and at least one side (or a side) in the first direction DR1 of the display area DA in the non-display area NDA. The gate driver GDR may include stages WRST, INST, and EMST (see FIG. 14) electrically connected to the gate lines GL.

The light emitting element layer 130 may be disposed on the circuit layer 120. The light emitting element layer 130 may include light emitting elements LEL (scc FIG. 5) respectively corresponding to the emission areas EA.

The light emitting elements LEL of the light emitting element layer 130 may be electrically connected to the pixel drivers PXD of the circuit layer 120, respectively.

The encapsulation layer 140 may be disposed on the light emitting element layer 130. The encapsulation layer 140 blocks permeation of oxygen or moisture into the light emitting element layer 130, and protects the light emitting element layer 130 from physical impact caused by foreign substances or the like within the spirit and the scope of the disclosure.

The display panel 100 of the display device 10 according to one embodiment may further include a touch sensor layer 150 disposed on the encapsulation layer 140.

The touch sensor layer 150 may include touch electrodes for sensing a touch of a person or an object.

The display device 10 according to one embodiment further may include the circuit board 200 disposed on a second surface of the substrate 110 opposite to the first surface of the substrate 110 on which the circuit layer 120 is disposed.

The display device 10 according to one embodiment may further include the display driving circuit 300 that is mounted on the non-display area NDA of the display panel 100 or the circuit board 200 and supplies data signals Vdata of the data lines DL of the circuit layer 120.

Further, the display device 10 according to one embodiment may further include a touch driving circuit (not shown) for driving the touch sensor layer 150.

The touch driving circuit may be provided as an integrated circuit and mounted on the circuit board 200.

The touch driving circuit may apply a touch driving signal to the driving electrodes of the touch sensor layer 150, and may sense a charge change amount of mutual capacitance based on a touch sensing signal of each of touch nodes received from the sensing electrodes of the touch sensor layer 150, thereby detecting a touch point on the display surface.

For example, the touch driving circuit may determine whether the user's touch has been made, whether the user is in proximity, and so forth, according to the touch sensing signal of each of the touch nodes. The user's touch refers to a direct contact of an object such as a pen or a user's finger with the front surface of the display device 10. The user's being in proximity means that an object such as a pen or a user's finger is positioned away from the front surface of the display device 10, such as hovering.

Figure 4:
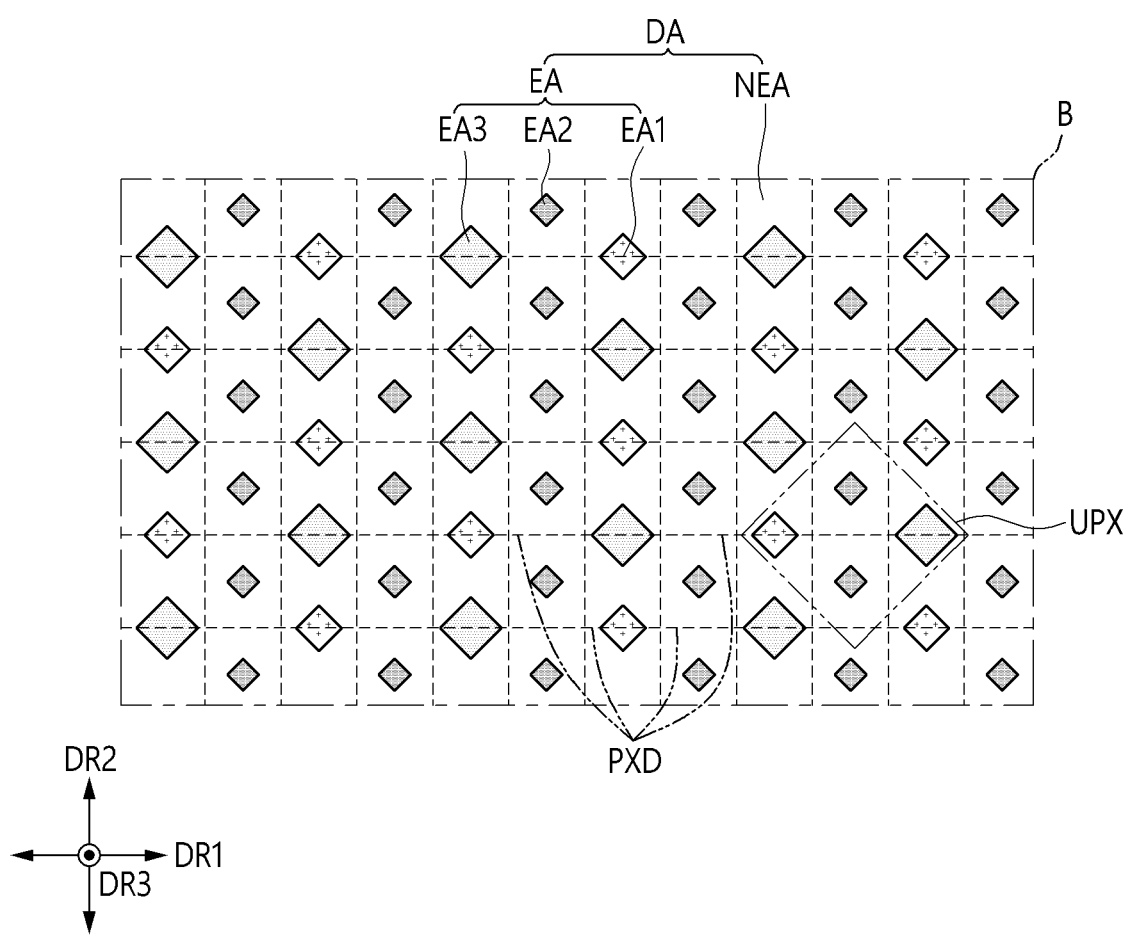
FIG. 4 is a schematic plan diagram illustrating part B of FIG. 1.

FIG. 4 is a schematic plan diagram illustrating part B of FIG. 1.

Referring to FIG. 4, the display area DA may include the emission areas EA arranged in the first direction DR1 or second direction DR2, and a non-emission area NEA that is a separation area between the emission areas EA.

For example, the first emission areas EA1 and the third emission areas EA3 may be alternately arranged in the first direction DR1 or the second direction DR2. Further, the second emission areas EA2 may be arranged side by side in the first direction DR1 or the second direction DR2.

The emission areas EA may include first emission areas EA1 emitting light of a first color in a selectable wavelength band, second emission areas EA2 emitting light of a second color in a wavelength band lower than that of the first color, and third emission areas EA3 emitting light of a third color in a wavelength band lower than that of the second color.

For example, the first color may be red having a wavelength band of approximately 600 nm to 750 nm. The second color may be green having a wavelength band of approximately 480 nm to 560 nm. The third color may be blue having a wavelength band of approximately 370 nm to 460 nm.

The unit pixels UPX may be provided by the emission areas EA.

For example, each of the unit pixels UPX may include at least one first emission area EA1, at least one second emission area EA2, and at least one third emission area EA3 that are adjacent to each other. Each of these unit pixels UPX may display a luminance and a color obtained by mixing lights emitted from at least one first emission area EA1, at least one second emission area EA2, and at least one third emission area EA3 that are adjacent to each other. Accordingly, the unit pixel UPX may be a minimum unit for displaying various colors including white with a selectable luminance.

As illustrated in FIG. 4, the third emission area EA3 may be greater than the first emission area EA1, and the first emission area EA1 may be greater than the second emission area EA2. However, this is by way of example, and the size of each of the first emission area EA1, the second emission area EA2, and the third emission area EA3 may be variously modified according to the gap between the emission areas EA, the luminance, or the like within the spirit and the scope of the disclosure.

Further, the arrangement of the first emission area EA1, the second emission area EA2, and the third emission area EA3 illustrated in FIG. 4 is an example, and may be variously modified according to the configuration of the unit pixel UPX.

Each of the emission areas EA may have a rhombus planar shape or a rectangular planar shape. However, this is only an example, and the planar shape of the emission areas EA according to one embodiment is not limited to that illustrated in FIG. 4. For example, the emission areas EA may have a polygonal shape other than a quadrangle, a circular shape, or an elliptical shape in plan view.

Figure 5:
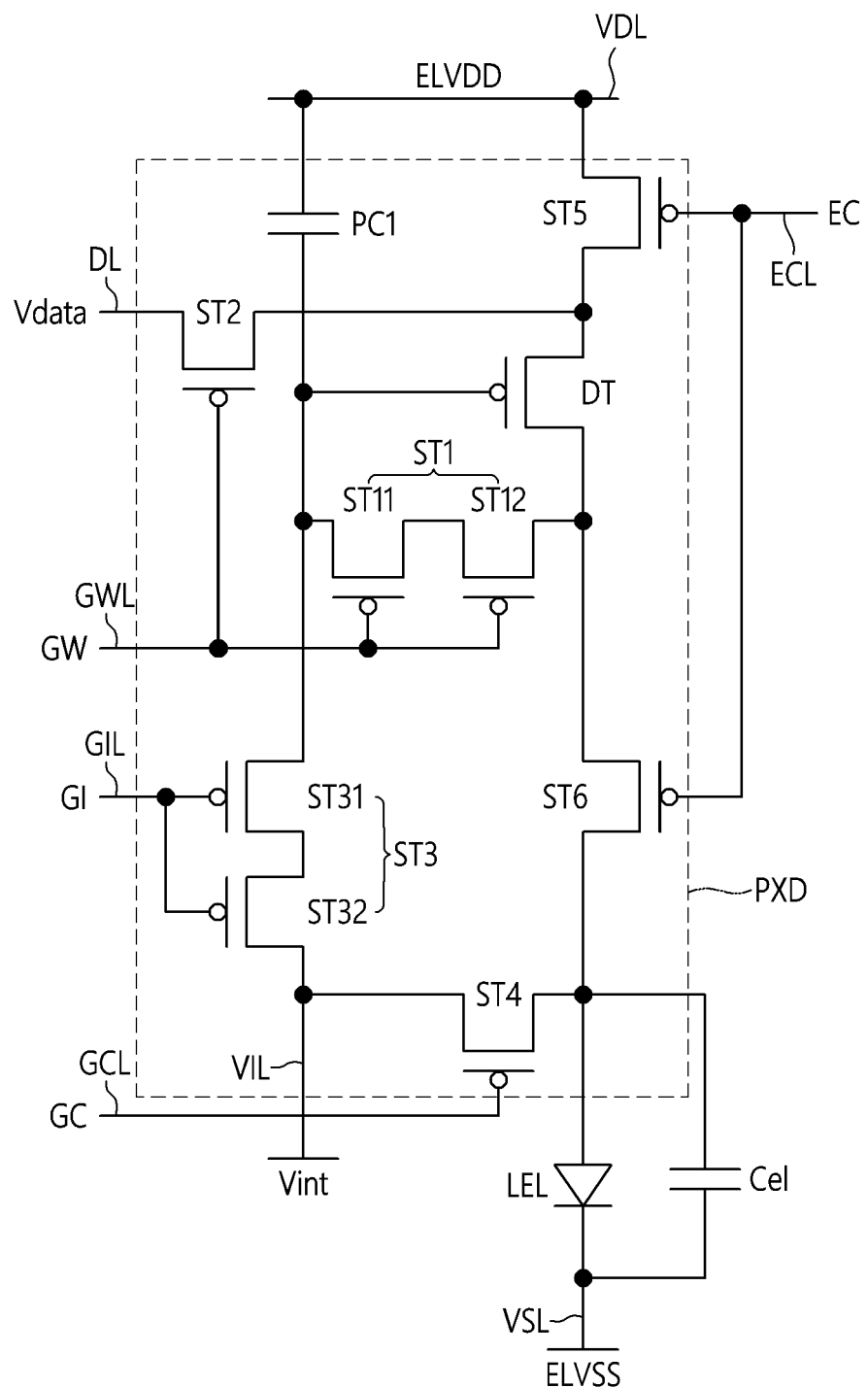
FIG. 5 is a schematic diagram of an equivalent circuit illustrating an example of a pixel driver corresponding to one emission area of the circuit layer of FIG. 3.

FIG. 5 is a schematic diagram of an equivalent circuit illustrating an example of a pixel driver corresponding to one emission area of the circuit layer of FIG. 3.

The circuit layer 120 of the display panel 100 of the display device 10 according to one embodiment may include the pixel drivers PXD respectively corresponding to the emission areas EA.

Referring to FIG. 5, the circuit layer 120 may further include the gate lines GL (GWL, GIL, ECL, and GCL) that transmit the gate signals GW, GI, EM, and GC to the pixel drivers PXD, the data line DL that transmits the data signal Vdata to the pixel drivers PXD, and a first power line VDL that transmits the first power ELVDD to the pixel drivers PXD. The first power line VDL may be electrically connected to the first power supply line VDSPL.

The circuit layer 120 may further include an initialization voltage line VIL that transmits an initialization voltage VINT to the pixel drivers PXD.

Further, the gate lines GL may include a scan write line GWL that transmits a scan write signal GW to the pixel driver PXD, a scan initialization line GIL that transmits a scan initialization signal GI to the pixel driver PXD, an emission control line ECL that transmits an emission control signal EC to the pixel driver PXD, and a gate control line GCL that transmits a gate control signal GC to the pixel driver PXD.

One pixel driver PXD among the pixel drivers PXD of the circuit layer 120 may include a driving transistor DT generating a driving current to drive the light emitting element LEL electrically connected to the one pixel driver PXD. One pixel driver PXD may further include two or more transistors ST1 to ST6 electrically connected to the driving transistor DT, and the at least one capacitor PC1.

For example, one pixel driver PXD may include the driving transistor DT, the first transistor ST1, the second transistor ST2, the third transistor ST3, the fourth transistor ST4, the fifth transistor ST5, and the sixth transistor ST6.

The gate electrode of the first transistor ST1 and the gate electrode of the second transistor ST2 may be electrically connected to the scan write line GWL.

The gate electrode of the third transistor ST3 may be electrically connected to the scan initialization line GIL.

The gate electrode of the fourth transistor ST4 may be electrically connected to the gate control line GCL.

The gate electrode of the fifth transistor ST5 and the gate electrode of the sixth transistor ST6 may be electrically connected to the emission control line ECL.

The pixel drivers PXD of the circuit layer 120 may be electrically connected to the light emitting elements LEL of the light emitting element layer 130, respectively.

An anode electrode 131 (see FIG. 8) of the light emitting element LEL may be electrically connected to the pixel driver PXD, and a cathode electrode 134 (see FIG. 8) of the light emitting element LEL may be electrically connected to a second power line VSL transmitting a second driving power ELVSS that has a voltage level lower than that of the first power ELVDD. The second power line VSL may be the second power supply line VSSPL.

The light emitting element LEL may be an organic light emitting diode having a light emitting layer made of an organic light emitting material. By way of example, the light emitting element LEL may be an inorganic light emitting element including a light emitting layer made of an inorganic semiconductor. By way of example, the light emitting element LEL may be a quantum dot light emitting element having a quantum dot light emitting layer. By way of example, the light emitting element LEL may be a micro light emitting diode.

A capacitor Ce1 connected in parallel with the light emitting element LEL refers to a parasitic capacitance between the anode electrode 131 and the cathode electrode 134.

The driving transistor DT is connected in series to the light emitting element LEL between the first power line VDL and the second power line VSL. For example, the first electrode (for example, the source electrode) of the driving transistor DT may be electrically connected to the first power line VDL through the fifth transistor ST5. Further, the second electrode (for example, the drain electrode) of the driving transistor DT may be electrically connected to the anode electrode 131 of the light emitting element LEL through the sixth transistor ST6.

The first electrode of the driving transistor DT may be electrically connected to the data line DL through the second transistor ST2.

The gate electrode of the driving transistor DT may be electrically connected to the first power line VDL through the first capacitor PC1. For example, the first capacitor PC1 may be electrically connected between the gate electrode of the driving transistor DT and the first power line VDL.

Accordingly, the potential of the gate electrode of the driving transistor DT may be maintained by the first power ELVDD of the first power line VDL.

Accordingly, in case that the data signal Vdata of the data line DL is transmitted to the first electrode of the driving transistor DT through the turned-on second transistor ST2, the voltage difference corresponding to the data signal Vdata and the first power ELVDD may be generated between the gate electrode of the driving transistor DT and the first electrodes of the driving transistor DT.

In case that the voltage difference between the gate electrode of the driving transistor DT and the first electrode of the driving transistor DT, for example, the gate-source voltage difference is greater than or equal to a threshold voltage, the driving transistor DT may be turned on.

Subsequently, in case that the fifth transistor ST5 and the sixth transistor ST6 are turned on, the driving transistor DT may be connected in series with the light emitting element LEL between the first power line VDL and the second power line VSL. Accordingly, a drain-source current corresponding to the data signal Vdata may be generated by the turned-on driving transistor DT and may be supplied as a driving current of the light emitting element LEL.

Accordingly, the light emitting element LEL may emit light having a luminance corresponding to the data signal Vdata.

The first transistor ST1 may be connected between the gate electrode of the driving transistor DT and the second electrode of the driving transistor DT.

The first transistor ST1 may include sub-transistors connected in series. For example, the first transistor ST1 may include a first sub-transistor ST11 and a second sub-transistor ST12.

The first electrode of the first sub-transistor ST11 may be connected to the gate electrode of the driving transistor DT, the second electrode of the first sub-transistor ST11 may be connected to the first electrode of the second sub-transistor ST12, and the second electrode of the second sub-transistor ST12 may be connected to the second electrode of the driving transistor DT.

In this way, it is possible to prevent the potential of the gate electrode of the driving transistor DT from changing due to the leakage current caused by the first transistor ST1 that is not turned on.

The second transistor ST2 may be connected between the first electrode of the driving transistor DT and the data line DL.

The gate electrode of each of the second transistor ST2, the first sub-transistor ST11, and the second sub-transistor ST12 may be connected to the scan write line GWL.

Accordingly, in case that the scan write signal GW is transmitted through the scan write line GWL, the second transistor ST2, the first sub-transistor ST11, and the second sub-transistor ST12 may be turned on.

The data signal Vdata may be transmitted to the first electrode of the driving transistor DT through the turned-on second transistor ST2.

Further, the gate electrode of the driving transistor DT and the second electrode of the driving transistor DT may have the same potential through the turned-on first sub-transistor ST11 and the turned-on second sub-transistor ST12.

Accordingly, the driving transistor DT may be turned on.

The third transistor ST3 may be connected between the gate electrode of the driving transistor DT and an initialization voltage line VIL.

The third transistor ST3 may include sub-transistors connected in series. For example, the third transistor ST3 may include a third sub-transistor ST31 and a fourth sub-transistor ST32.

The first electrode of the third sub-transistor ST31 may be connected to the gate electrode of the driving transistor DT, the second electrode of the third sub-transistor ST31 may be connected to the first electrode of the fourth sub-transistor ST32, and the second electrode of the fourth sub-transistor ST32 may be connected to the initialization voltage line VIL.

In this way, it is possible to prevent the potential of the gate electrode of the driving transistor DT from changing due to the leakage current caused by the third transistor ST3 that is not turned on.

The gate electrode of each of the third sub-transistor ST31 and the fourth sub-transistor ST32 may be connected to the scan initialization line GIL.

Accordingly, in case that the scan initialization signal GI is transmitted through the scan initialization line GIL, the third sub-transistor ST31 and the fourth sub-transistor ST32 are turned on and, thus, the potential of the gate electrode of the driving transistor DT may be initialized to the initialization voltage Vint of the initialization voltage line VIL.

The fourth transistor ST4 may be connected between the anode electrode of the light emitting element LEL and the initialization voltage line VIL.

The gate electrode of the fourth transistor ST4 may be connected to the gate control line GCL.

Accordingly, in case that the gate control signal GC is transmitted through the gate control line GCL, the fourth transistor ST4 may be turned on.

The potential of the anode electrode of the light emitting element LEL may be initialized to the initialization voltage Vint of the initialization voltage line VIL through the turned-on fourth transistor ST4.

Accordingly, it is possible to prevent the light emitting element LEL from being driven by the current remaining in the anode electrode.

The fifth transistor ST5 may be connected between the first electrode of the driving transistor DT and the first power line VDL.

The sixth transistor ST6 may be connected between the second electrode of the driving transistor DT and the anode electrode of the light emitting element LEL.

The gate electrode of each of the fifth transistor ST5 and the sixth transistor ST6 may be connected to the emission control line ECL.

Accordingly, in case that the emission control signal EC is transmitted through the emission control line ECL, the fifth transistor ST5 and the sixth transistor ST6 are turned on and, thus, the drain-source current of the driving transistor DT may be supplied as the driving current of the light emitting element LEL.

Although FIG. 5 illustrates a case in which the driving transistor DT and the first to sixth transistors ST1 to ST6 included in one pixel driver PXD are all N-type metal oxide semiconductor field effect transistors (MOSFET), it should be noted that the pixel driver PXD of one embodiment is not limited to that illustrated in FIG. 5. For example, at least one of the driving transistor DT and the first to sixth transistors ST1 to ST6 included in the pixel driver PXD according to one embodiment may be a P-type MOSFET.

Although not separately shown, one pixel driver PXD may include the driving transistor DT and the first to sixth switch elements ST1 to ST6 among which the driving transistor DT, the second transistor ST2, the fourth transistor ST4, the fifth transistor ST5, and the sixth transistor ST6 are implemented as P-type MOSFETs having an active layer of a polysilicon semiconductor material, while the first transistor ST1 and the third transistor ST3 may be implemented as N-type MOSFETs having an active layer of an oxide semiconductor material.

Since the first transistor ST1 is not turned on with the same signal as the signal for the second transistor ST2, the gate electrode of the first transistor ST1 and the gate electrode of the fourth transistor ST4 may be connected to the gate control line GCL. Accordingly, the fourth transistor ST4 may be turned on in case that the gate control signal GC of the gate control line GCL is supplied at a low level, and the first transistor ST1 may be turned on in case that the gate control signal GC of the gate control line GCL is supplied at a high level.

Further, the third transistor ST3 may be turned on in case that the scan initialization signal GI of the scan initialization line GIL is supplied at a high level.

The gate control signal GC for driving turn-on and turn-off of the N-type MOSFET is different from the scan write signal GW, the scan initialization signal GI, and the emission control signal EC for driving turn-on and turn-off of the P-type MOSFET, so that the circuit board 200 may provide gate level voltages for generating the scan write signal GW, the scan initialization signal GI, and the emission control signal EC, and gate level voltages for generating the gate control signal GC to the gate driver GDR.

Figure 6:
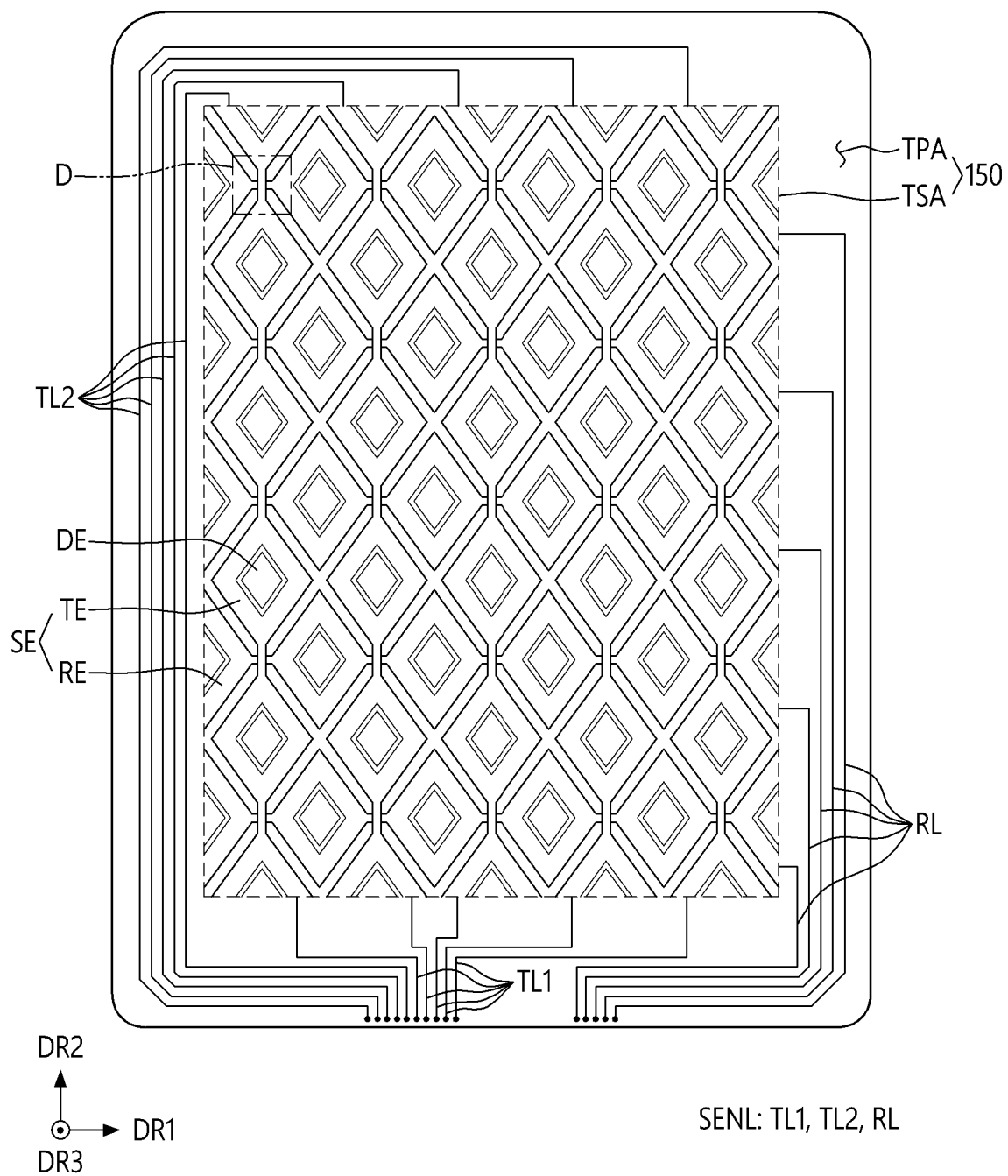
FIG. 6 is a schematic plan diagram showing an example of the touch sensor layer of FIG. 3.
Figure 7:
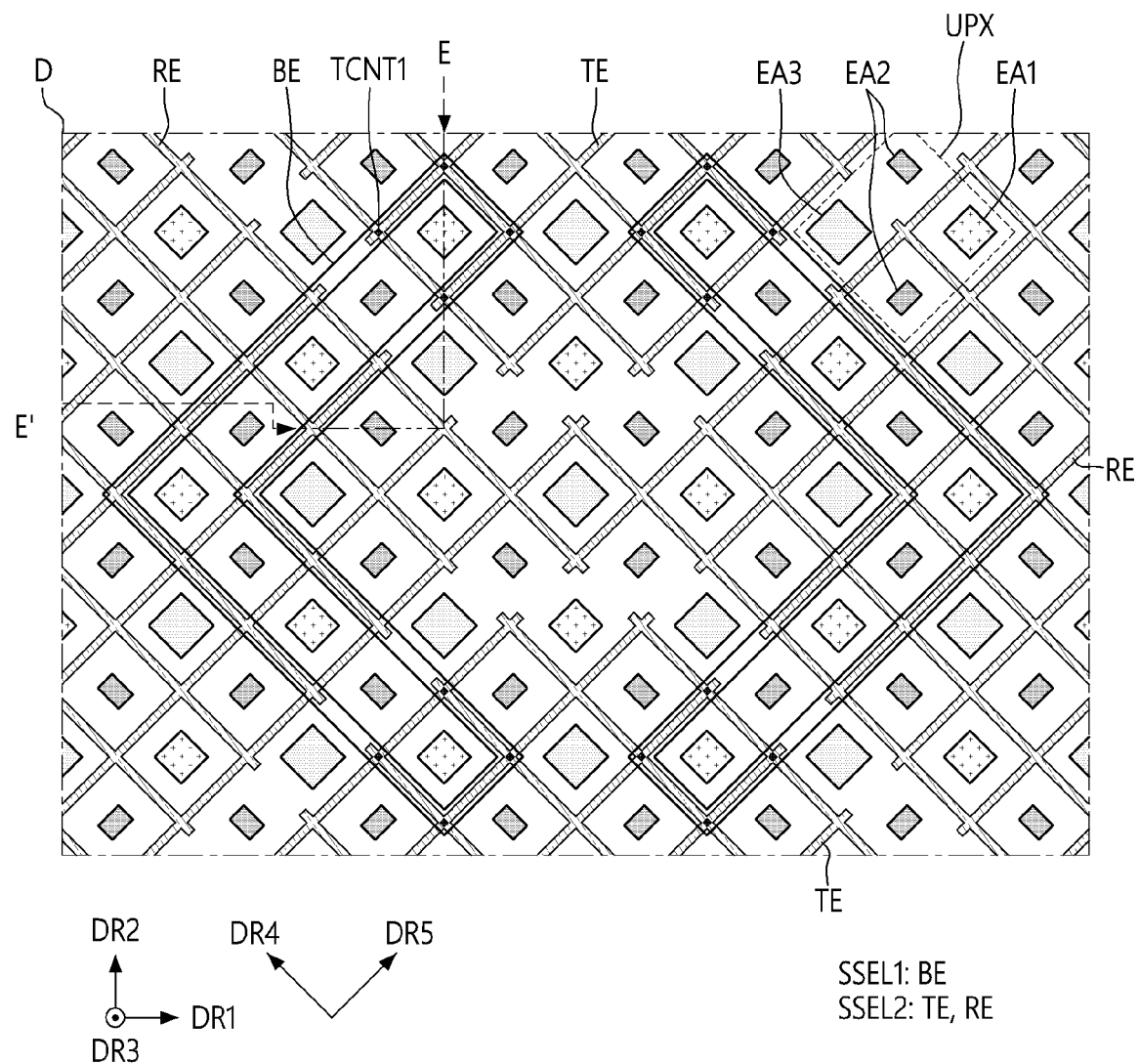
FIG. 7 is an enlarged view illustrating part D of FIG. 6 in detail.
Figure 8:
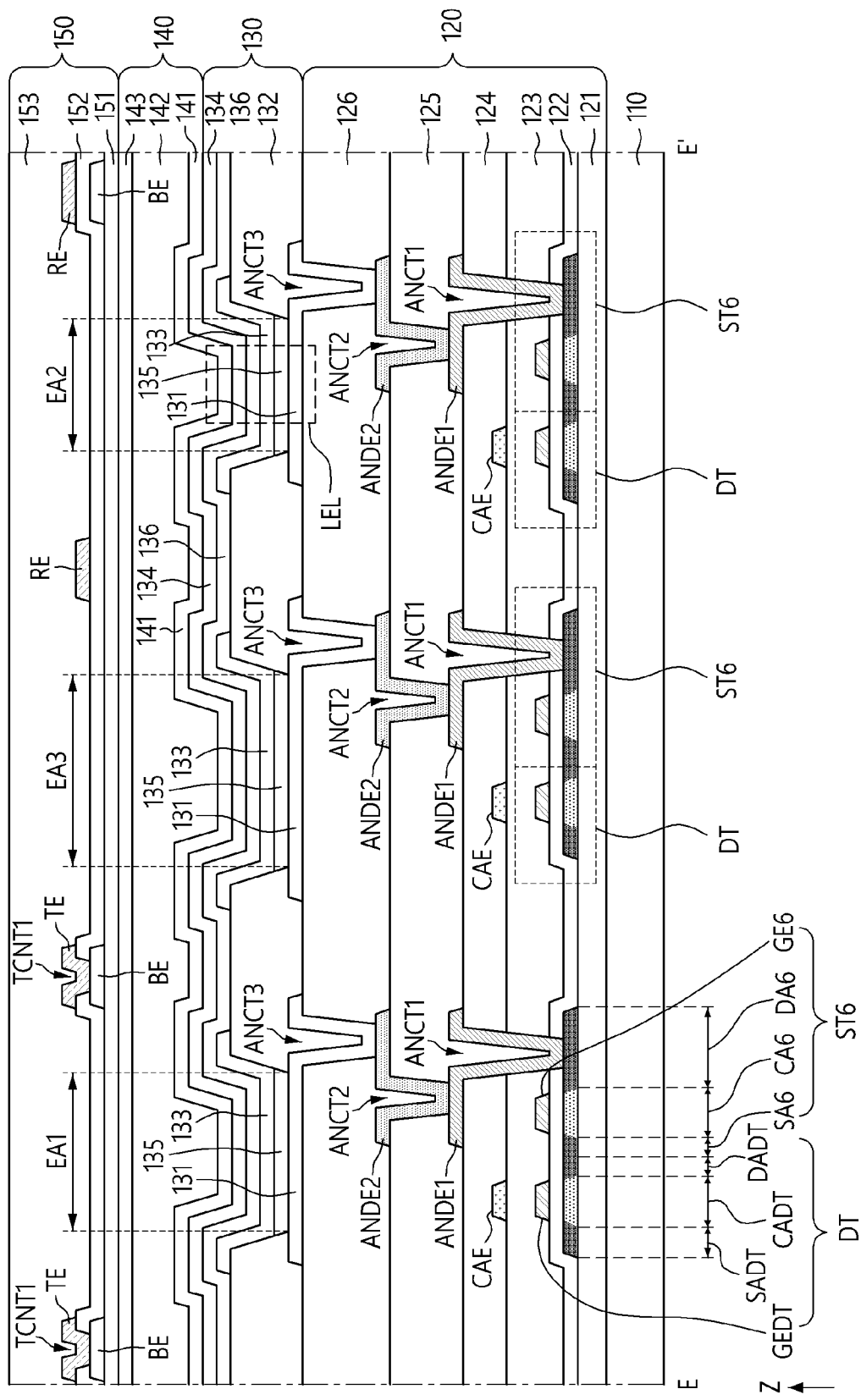
FIG. 8 is a schematic cross-sectional view taken along line E-E' of FIG. 7.

FIG. 6 is a schematic plan diagram showing an example of the touch sensor layer of FIG. 3. FIG. 7 is an enlarged view illustrating part D of FIG. 6 in detail. FIG. 8 is a schematic cross-sectional view taken along line E-E' of FIG. 7.

FIG. 6 illustrates the touch sensor layer 150 of a capacitance method. The touch driving circuit (not shown) may sense a touch based on whether capacitance fluctuations. However, FIG. 6 is an example for description, and the touch sensor layer 150 according to one embodiment is not limited to that illustrated in FIG. 6.

FIG. 6 illustrates a number of the components of the touch sensor layer 150 for simplicity of description.

Referring to FIG. 6, the touch sensor layer 150 may include a touch sensing area TSA for sensing a user's touch and a touch periphery area TPA around the touch sensing area TSA.

The touch sensing area TSA has a wider width than the display area DA and may be similar to the display area DA. Accordingly, the touch periphery area TPA, which is a periphery of the touch sensing area TSA, may be similar to the non-display area NDA, which is a periphery of the display area DA.

For example, the touch sensing area TSA may overlap the display area DA and the edge of the non-display area NDA in contact with the display area DA. The touch periphery area TPA may overlap the remaining part of the non-display area NDA that does not correspond to the touch sensing area TSA.

The touch sensor layer 150 may include sensor electrodes SE and dummy electrodes DE that are matrix-arranged in the touch sensing area TSA and generate mutual capacitance, and sensor lines disposed in the touch periphery area TPA.

The sensor electrodes SE may include a driving electrode TE (touch driving electrode) to which a driving signal is applied, and a sensing electrode RE (receiving electrode) to sense a voltage charged in mutual capacitance with the driving electrode TE.

The sensor lines may include a first driving line TL1, a second driving line TL2, and a sensing line RL.

Each of the first driving line TL1 and the second driving line TL2 may be electrically connected to two or more driving electrodes TE extending in the second direction DR2 among the driving electrodes TE.

The first driving line TL1 may extend from one side of the touch sensing area TSA which extends in the first direction DR1, to one side of the substrate 110.

The second driving line TL2 may extend from other side of the touch sensing area TSA which extends in the first direction DR1, to the one side of the substrate 110 through a portion of the touch periphery area TPA that is in contact with one side of the touch sensing area TSA in the first direction DR1.

The sensing line RL may be electrically connected to two or more sensing electrodes RE extending in the first direction DR1 among the sensing electrodes RE.

The sensing electrodes RE may be arranged in parallel in the first direction DR1. The sensing electrodes RE adjacent in the first direction DR1 may be electrically connected to each other through a protruding portion in the first direction DR1.

The driving electrodes TE may be arranged in parallel in the second direction DR2. The driving electrodes TE adjacent in the second direction DR2 may be electrically connected to each other through a bridge electrode BE (see FIG. 7) in the second direction DR2.

Each of the driving electrodes TE and the sensing electrodes RE may have a shape surrounding the dummy electrode DE disposed in the center thereof.

Each of the dummy electrodes DE may be spaced apart from the driving electrode TE or the sensing electrode RE that surrounds it. The dummy electrode DE may be maintained in a floating state.

Although FIG. 6 illustrates that each of the driving electrode TE, the sensing electrode RE, and the dummy electrode DE has a rhombic planar shape, one embodiment is not limited to that illustrated in FIG. 6. For example, the planar shape of the driving electrode TE, the sensing electrode RE, and the dummy electrode DE may be a quadrilateral shape other than a rhombus, a polygonal shape other than a quadrilateral shape, a circular shape, or an elliptical shape.

Referring to FIG. 7, the bridge electrode BE may be provided as a first sensor electrode layer SSEL1, and the driving electrode TE and the sensing electrode RE may be provided as a second sensor electrode layer SSEL2.

The driving electrode TE and the sensing electrode RE may be spaced apart from each other.

Although FIG. 7 illustrates the bridge electrode BE having a shape including at least one bend, the shape of the bridge electrode BE according to one embodiment is not limited to that illustrated in FIG. 7.

The driving electrodes TE adjacent in the second direction DR2 may be electrically connected to each other through two or more bridge electrodes BE. In this way, reliability of the electrical connection between the driving electrodes TE may be improved.

Although FIG. 7 illustrates that two bridge electrodes BE parallel to each other are disposed between the driving electrodes TE adjacent to each other in the second direction DR2, one embodiment is not limited to that illustrated in FIG. 7.

The bridge electrode BE may be electrically connected to the driving electrodes TE through touch contact holes TCNT1.

The driving electrode TE, the sensing electrode RE, and the bridge electrode BE may have a mesh or net structure in plan view. The dummy electrodes DE may also have a mesh or net structure in plan view. In this way, since the overlapping width of the driving electrode TE, the sensing electrode RE, the dummy electrode DE, and the bridge electrode BE in the emission areas EA may be reduced, a decrease in light emission efficiency due to the driving electrode TE, the sensing electrode RE, the dummy electrode DE, and the bridge electrode BE may be reduced.

The emission areas EA may include the first emission area EA1 emitting light of the first color, the second emission area EA2 emitting light of the second color having a wavelength band lower than that of the first color, and the third emission area EA3 emitting light of the third color having a wavelength band lower than that of the second color. For example, the first color, the second color, and the third color may be red, green, and blue, respectively.

The first emission area EA1 and the third emission area EA3 may be alternately arranged in the first direction DR1 and the second direction DR2.

The second emission area EA2 may be adjacent to the first emission area EA1 and the third emission area EA3 in the fourth direction DR4 and the fifth direction DR5, respectively. The second emission area EA2 may be arranged in parallel in the first direction DR1 and the second direction DR2.

The fourth direction DR4 is a diagonal direction between the first direction DR1 and the second direction DR2. The fifth direction DR5 is a direction orthogonal to the fourth direction DR4. For example, the fourth direction DR4 may be a direction inclined by 45° with respect to the first direction DR1.

Although FIG. 7 illustrates that each of the emission areas EA has a rhombic or rectangular planar shape, the planar shape of the emission areas EA according to one embodiment is not limited to that illustrated in FIG. 7. For example, each of the emission areas EA may have a planar shape such as a polygonal shape other than a quadrilateral shape, a circular shape, or an elliptical shape.

As illustrated in FIG. 7, in a case where the first color of the first emission area EA1, the second color of the second emission area EA2, and the third color of the third emission area EA3 are red, green, and blue, respectively, the third emission area EA3 may have a larger width than the first emission area EA1, and the second emission area EA2 may have a smaller width than the first emission area EA1. However, this is an example, and the width of each of the emission areas EA is not limited to that illustrated in FIG. 7.

Referring to FIG. 8, the display panel 100 of the display device 10 according to one embodiment may include the substrate 110, the circuit layer 120 on the substrate 110, the light emitting element layer 130 on the circuit layer 120, the encapsulation layer 140 on the light emitting element layer 130, and the touch sensor layer 150 on the encapsulation layer 140.

The substrate 110 may be formed of an insulating material such as a polymer resin. For example, the substrate 110 may contain polyimide.

The circuit layer 120 may include the pixel drivers PXD respectively corresponding to the emission areas EA.

The pixel drivers PXD may include the driving transistor DT and two or more transistors ST1 to ST6 electrically connected to the driving transistor DT.

In accordance with one embodiment, each of the two or more transistors ST1 to ST6 and the driving transistor DT (for example, the driving transistor DT and the sixth transistor ST6) may include a channel area CADT and CA6, a source area SADT and SA6, and a drain area DADT and DA6, which are formed of a semiconductor layer, and a gate electrode GEDT and GE6 formed of a first gate conductive layer on a first gate insulating layer 122 covering the semiconductor layer.

The source area SADT and SA6 and the drain area DADT and DA6 may be connected to both sides of the channel area CADT and CA6. The source area SADT and SA6 and the drain area DADT and DA6 may have higher conductivity than that of the channel area CADT and CA6.

The gate electrode GEDT and GE6 overlaps the channel area CADT and CA6.

The first capacitor PC1 of the pixel drivers PXD may be provided as an overlapping area between a gate electrode GEDT of the driving transistor DT and a capacitor electrode CAE. The capacitor electrode CAE may be formed of a second gate conductive layer on a second gate insulating layer 123 covering the first gate conductive layer.

The anode electrode 131 of the light emitting element layer 130 may be electrically connected to a drain area DA6 of the sixth transistor ST6 through a first anode connection electrode ANDE1 and a second anode connection electrode ANDE2.

The first anode connection electrode ANDE1 may be formed of a first source-drain conductive layer on a first interlayer insulating layer 124 covering the second gate conductive layer. The first anode connection electrode ANDE1 may be electrically connected to the drain area DA6 of the sixth transistor ST6 through a first anode contact hole ANCT1 penetrating the first interlayer insulating layer 124, the second gate insulating layer 123, and the first gate insulating layer 122.

The second anode connection electrode ANDE2 may be formed of a second source-drain conductive layer on a first planarization layer 125 covering the first source-drain conductive layer. The second anode connection electrode ANDE2 may be electrically connected to the first anode connection electrode ANDE1 through a second anode contact hole ANCT2 penetrating the first planarization layer 125.

The anode electrode 131 of the light emitting element layer 130 may be disposed on a second planarization layer 126 covering the second source-drain conductive layer. The anode electrode 131 may be electrically connected to the second anode connection electrode ANDE2 through a third anode contact hole ANCT3 penetrating the second planarization layer 126.

In other words, the circuit layer 120 may include a buffer layer 121 disposed on the substrate 110, semiconductor layers CADT, SADT, DADT, CA6, SA6, and DA6 disposed on the buffer layer 121, the first gate insulating layer 122 covering the semiconductor layers, first gate conductive layers GEDT and GE6 disposed on the first gate insulating layer 122, the second gate insulating layer 123 covering the first gate conductive layer, the second gate conductive layer CAE disposed on the second gate insulating layer 123, the first interlayer insulating layer 124 covering the second gate conductive layer, the first source-drain conductive layer ADNE1 disposed on the first interlayer insulating layer 124, the first planarization layer 125 covering the first source-drain conductive layer, the second source-drain conductive layer ANDE2 disposed on the first planarization layer 125, and the second planarization layer 126 covering the second source-drain conductive layer.

Each of the buffer layer 121, the first gate insulating layer 122, the second gate insulating layer 123, and the first interlayer insulating layer 124 may be formed of at least one inorganic layer. For example, each of the buffer layer 121, the first gate insulating layer 122, the second gate insulating layer 123, and the interlayer insulating layer 124 may be formed of multiple layers in which one or more inorganic layers of a silicon nitride layer, a silicon oxynitride layer, a silicon oxide layer, a titanium oxide layer, and an aluminum oxide layer may be alternately stacked each other.

Each of the first planarization layer 125 and the second planarization layer 126 may be formed of an organic layer such as acryl resin, epoxy resin, phenolic resin, polyamide resin, polyimide resin and the like within the spirit and the scope of the disclosure.

The semiconductor layer may be made of a semiconductor material of one of polysilicon, amorphous silicon, and an oxide semiconductor.

In the semiconductor layer, the channel area CADT and CA6 overlapping the gate electrode GEDT and GE6 may maintain semiconductor characteristics, and the source area SADT and SA6 and the drain area DADT and DA6 that are the other areas may become conductive.

Each of the first gate conductive layer, the second gate conductive layer, the first source-drain conductive layer, and the second source-drain conductive layer may be formed as multiple layers made of two or more materials among molybdenum (Mo), aluminum (Al), chromium (Cr), gold (Au), titanium (Ti), nickel (Ni), neodymium (Nd), and copper (Cu).

For example, each of the first gate conductive layer and the second gate conductive layer may be formed of a single layer including molybdenum (Mo).

Further, each of the first source-drain conductive layer and the second source-drain conductive layer may be formed as a triple layer of Ti/Al/Ti.

The light emitting element layer 130 may include the light emitting elements LEL respectively corresponding to the emission areas EA.

Each of the light emitting elements LEL may include the anode electrode 131 and the cathode electrode 134 facing each other, and a light emitting layer 133 disposed therebetween. By way of example, each of the light emitting elements LEL may further include a first common layer 135 disposed between the anode electrode 131 and the light emitting layer 133, and a second common layer 136 disposed between the light emitting layer 133 and the cathode electrode 134.

For example, the light emitting element layer 130 may include the anode electrodes 131 respectively corresponding to the emission areas EA, a pixel defining layer 132 corresponding to the non-emission area NEA and covering the edge of the anode electrode 131, the first common layers 135 respectively disposed on the anode electrodes 131, the light emitting layers 133 respectively disposed on the first common layers 135, the second common layer 136 corresponding to the emission areas EA and disposed on the light emitting layers 133 and the pixel defining layer 132, and the cathode electrode 134 disposed on the second common layer 136.

The anode electrode 131 may be disposed in each of the emission areas EA and may be electrically connected to one pixel driver PXD of the circuit layer 120. This anode electrode 131 may be referred to as a pixel electrode.

The anode electrode 131 may be formed of a metal material, having high reflectivity, such as a stacked structure (Ti/Al/Ti) of aluminum (Al) and titanium (Ti), a stacked structure (ITO/Al/ITO) of Al and indium tin oxide (ITO), an APC alloy, a stacked structure (ITO/APC/ITO) of an APC alloy and ITO, or the like within the spirit and the scope of the disclosure. The APC alloy is an alloy of silver (Ag), palladium (Pd) and copper (Cu).

The first common layer 135 on the anode electrode 131 may be disposed in each of the emission areas EA. The first common layer 135 may include a hole transport layer. By way of example, the first common layer 135 may further include a hole injection layer between the anode electrode 131 and the hole transport layer.

The light emitting layer 133 on the first common layer 135 may be disposed in each of the emission areas EA. The light emitting layer 133 of the first emission area EA1, the light emitting layer 133 of the second emission area EA2, and the light emitting layer 133 of the third emission area EA3 may include organic light emitting materials having different materials or contents.

For example, the light emitting layer 133 may be formed of an organic light emitting material that converts electron-hole pairs into light.

The organic light emitting material may include a host material and a dopant. The dopant may include a phosphorescent material or a fluorescent material.

The light emitting layer 133 of the first emission area EA1 emitting the first color may include a host material including carbazole biphenyl (CBP) or 1,3-bis(carbazol-9-yl) (mCP).

Further, the dopant of the light emitting layer 133 of the first emission area EA1 may be selected as any one or more phosphorescent materials selected among bis(1-phenylisoquinoline) acetylacetonate iridium (PIQIr (acac)), bis(1-phenylquinoline) acetylacetonate iridium (PQIr (acac)), tris (1-phenylquinoline) iridium (PQIr), and octaethylporphyrin platinum (PtOEP), or a florescent material including PBD: Eu (DBM) 3 (Phen) or perylene.

The light emitting layer 133 of the second emission area EA2 emitting the second color having a wavelength band lower than that of the first color may include a host material including CBP or mCP.

Further, a phosphorescent material including fac tris(2-phenylpyridine) iridium (Ir(ppy)3), or a fluorescent material including tris(8-hydroxyquinolino)aluminum (Alq3) may be selected as the dopant of the light emitting layer 133 of the second emission area EA2.

The light emitting layer 133 of the third emission area EA3 emitting the third color having a wavelength band lower than that of the second color may include a host material including CBP or mCP.

A phosphorescent material including (4,6-F2ppy) 2Irpic or L2BD111 may be selected as the dopant of the light emitting layer 133 of the third emission area EA3.

The description of the organic light emitting material of the light emitting layer 133 is only an example, and the material of the light emitting layer 133 according to one embodiment is not limited to the above description.

The second common layer 136 under (or below) the cathode electrode 134 may be entirely disposed in the display area DA including the emission areas EA. The second common layer 136 may include an electron transport layer. By way of example, the second common layer 136 may further include an electron injection layer between the cathode electrode 134 and the electron transport layer.

The cathode electrode 134 may be entirely disposed in the display area DA including the emission areas EA and may be electrically connected to the second power line VSL (see FIG. 5). The cathode electrode 134 may be referred to as a common electrode.

The cathode electrode 134 may include a transparent conductive material (TCO) such as ITO or IZO that can transmit light or a semi-transmissive conductive material such as magnesium (Mg), silver (Ag), or an alloy of Mg and Ag. In case that the cathode electrode 134 is made of a semi-transmissive conductive material, an improvement in light output efficiency due to a micro cavity effect may be expected.

The encapsulation layer 140 may be disposed on the circuit layer 120 and cover the light emitting device layer 130.

The encapsulation layer 140 may include a first encapsulation layer 141 disposed on the light emitting element layer 130 and made of an inorganic insulating material, a second encapsulation layer 142 disposed on the first encapsulation layer 141, overlapping the light emitting element layer 130, and made of an organic insulating material, and a third encapsulation layer 143 disposed on the first encapsulation layer 141, covering the second encapsulation layer 142, and made of an inorganic insulating material.

The second encapsulation layer 142 may be formed of an organic insulating material such as acryl resin, epoxy resin, phenolic resin, polyamide resin, polyimide resin and the like within the spirit and the scope of the disclosure.

The second encapsulation layer 142 may be prepared by a process in which an organic material in a liquid state is dropped onto the first encapsulation layer 141, is widely diffused to cover the display area DA, and is cured.

Accordingly, the display panel 100 of the display device 10 according to one embodiment may further include a dam DAM (see FIG. 12) to limit the diffusion range of the organic material of the second encapsulation layer 142. The dam DAM may have a shape surrounding the periphery of the display area DA. The display panel 100 may include one or more dams DAM (DML1, DML2, DML3) sequentially arranged in the non-display area NDA.

Since the second encapsulation layer 142 is diffused to the dam DAM, the third encapsulation layer 143 may be in contact with the first encapsulation layer 141 between the dam DAM and the edge of the substrate 110 in the non-display area NDA. Accordingly, an encapsulation structure formed by adhesion of inorganic materials may be provided.

Each of the first encapsulation layer 141 and the third encapsulation layer 143 may have a structure in which one or more inorganic layers of a silicon nitride layer, a silicon oxynitride layer, a silicon oxide layer, a titanium oxide layer, and an aluminum oxide layer may be stacked each other.

The touch sensor layer 150 may be disposed on the encapsulation layer 140.

The touch sensor layer 150 may include a first sensor insulating layer 151 covering the encapsulation layer 140, a first sensor electrode layer SSEL1 (see FIG. 7) disposed on the first sensor insulating layer 151 and including the bridge electrode BE, a second sensor insulating layer 152 covering the first sensor electrode layer SSEL1, a second sensor electrode layer SSEL2 (see FIG. 7) disposed on the second sensor insulating layer 152 and including the driving electrode TE and the sensing electrode RE, and a sensor planarization layer 153 flatly covering the second sensor electrode layer SSEL2.

Each of the first sensor insulating layer 151 and the second sensor insulating layer 152 may have a structure in which one or more inorganic layers of a silicon nitride layer, a silicon oxynitride layer, a silicon oxide layer, a titanium oxide layer, and an aluminum oxide layer may be stacked each other.

Although not shown in detail, the second sensor insulating layer 152 may be in contact with the third encapsulation layer 143 of the encapsulation layer 140 in the touch periphery area TPA in order to block permeation of oxygen or moisture.

The sensor planarization layer 153 may be made of an organic material that can be disposed in a low-temperature process. For example, the sensor planarization layer 153 may be made of a negative photoresist material.

The first sensor electrode layer SSEL1 including the bridge electrode BE may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second sensor electrode layer SSEL2 including the driving electrode TE and the sensing electrode RE may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second sensor electrode layer SSEL2 may further include a dummy electrode DE disposed in each of the driving electrode TE and the sensing electrode RE, the first driving line TL1 and the second driving line TL2 connected to the driving electrode TE, and the sensing line RL connected to the sensing electrode RE.

The driving electrode TE may be electrically connected to the bridge electrode BE through the touch contact hole TCNT1 penetrating the second sensor insulating layer 152.

The second sensor electrode layer SSEL2 including the driving electrode TE, the sensing electrode RE, the dummy electrode DE, the first driving line TL1 and the second driving line TL2, and the sensing line RL may have a structure including a low reflective layer. In this way, the amount of light that is incident from the outside, reflected within the display panel 100, and emitted (for example, the reflection of external light) may be reduced.

FIG. 9 is a schematic plan diagram illustrating part C of FIG. 1.

FIG. 9 is a schematic plan diagram showing a part of the circuit layer 120 adjacent to a curved corner CVE of the substrate 110.

Referring to FIG. 9, the circuit layer 120 of the display panel 100 of the display device 10 according to one embodiment may include the gate lines GL disposed in the display area DA and extending in the first direction DR1, and the data lines DL disposed in the display area DA and extending in the second direction DR2.

The gate lines GL may include the scan write line GWL that transmits the scan write signal GW for sequentially writing data into the pixel drivers PXD, the scan initialization line GIL and the gate control line GCL that respectively transmit the scan initialization signal GI and the gate control signal GC for sequentially initializing the pixel drivers PXD, and the emission control line ECL that transmits the emission control signal EC for controlling the driving current output of the pixel drivers PXD.

The gate driver GDR supplies a signal to each of the gate lines GL. The gate driver GDR may be disposed between the edge of the substrate 110 and at least one side in the first direction DR1 of the display area DA in the non-display area NDA.

The gate driver GDR may include the stages ST (see FIG. 13) arranged side by side and respectively electrically connected to the gate lines GL.

Further, the gate driver GDR may include stage groups STG and STG' formed by dividing the stages ST. For example, each of the stage groups STG and STG' may be formed of two or more consecutive stages.

In other words, the gate driver GDR may include the stage groups STG and STG' arranged side by side, each of the stage groups STG and STG' may be formed of two or more consecutive stages ST, and the stages ST may be respectively electrically connected to the gate lines GL. For example, each of the stage groups STG and STG' may correspond to two or more consecutive stages ST.

The gap between the stage groups STG and STG' may be greater than the gap between the two or more consecutive stages ST.

The stage groups STG and STG' formed by dividing the stages ST are arranged along the edge of the substrate 110. Accordingly, some of the stage groups STG' of the gate driver GDR may be arranged side by side with the curved corner CVE in the edge of the substrate 110, and the other stage groups STG' may be arranged side by side with a straight edge STE in the edge of the substrate 110.

The circuit layer 120 may further include the first power supply line VDSPL and the second power supply line VSSPL that are disposed in the non-display area NDA and transmit the first power ELVDD and the second power ELVSS, respectively.

The second power supply line VSSPL is electrically connected to the circuit board 200 disposed on the second surface of the substrate 110 through second power connection portions VSCN.

In accordance with one embodiment, the second power supply line VSSPL may overlap a part of the gate driver GDR. For example, the second power supply line VSSPL may have a shape surrounding most of the edge of the display area DA.

Further, the second power connection portions VSCN for electrical connection between the second power supply line VSSPL and the circuit board 200 may be disposed between some stage groups STG' adjacent to the curved corner CVE of the substrate 110 among the stage groups STG and STG' of the gate driver GDR.

For example, the second power connection portions VSCN are disposed between some stages ST adjacent to the curved corner CVE of the substrate 110 among the stages ST of the gate driver GDR.

The first power supply line VDSPL may be disposed on one side of the second direction DR2 of the display area DA in the non-display area NDA. By way of example, the first power supply line VDSPL may be disposed between the display area DA and the second power supply line VSSPL.

The first power supply line VDSPL may be electrically connected to the circuit board 200 disposed on the second surface of the substrate 110 through first power connection portions VDCN.

In accordance with one embodiment, the circuit layer 120 may further include data supply lines DTSPL, an initialization voltage supply line VISPL, and gate driving control lines GDCL that are disposed on one side of the second direction DR2 of the display area DA in the non-display area NDA.

The data supply lines DTSPL may be respectively electrically connected between the data lines DL and data connection portions DTCN, and may be electrically connected to the circuit board 200 through the data connection portions DTCN. Accordingly, the data lines DL may receive each data signal Vdata from the circuit board 200.

The initialization voltage supply line VISPL for transmitting the initialization voltage Vint may be electrically connected to the circuit board 200 through initialization voltage connection portions VICN. The initialization voltage line VIL may be electrically connected to the initialization voltage supply line VISPL.

The gate driving control lines GDCL for transmitting control signals and voltages for generating a gate signal to the stages ST of the gate driver GDR may be electrically connected to the circuit board 200 through gate control connection portions GCCN.

Figure 10:
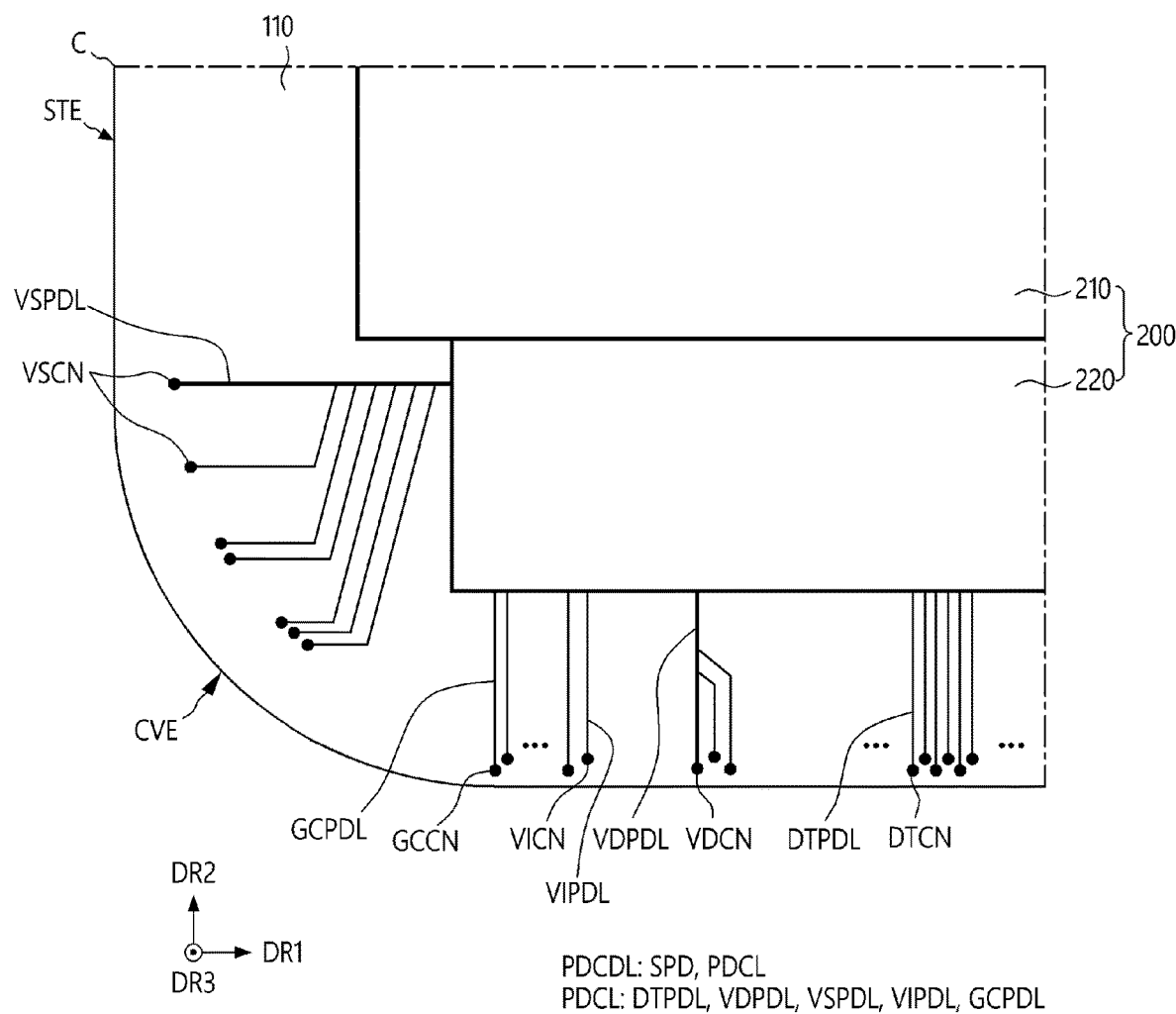
FIG. 10 is a schematic plan diagram illustrating part C of FIG. 2.
Figure 11:
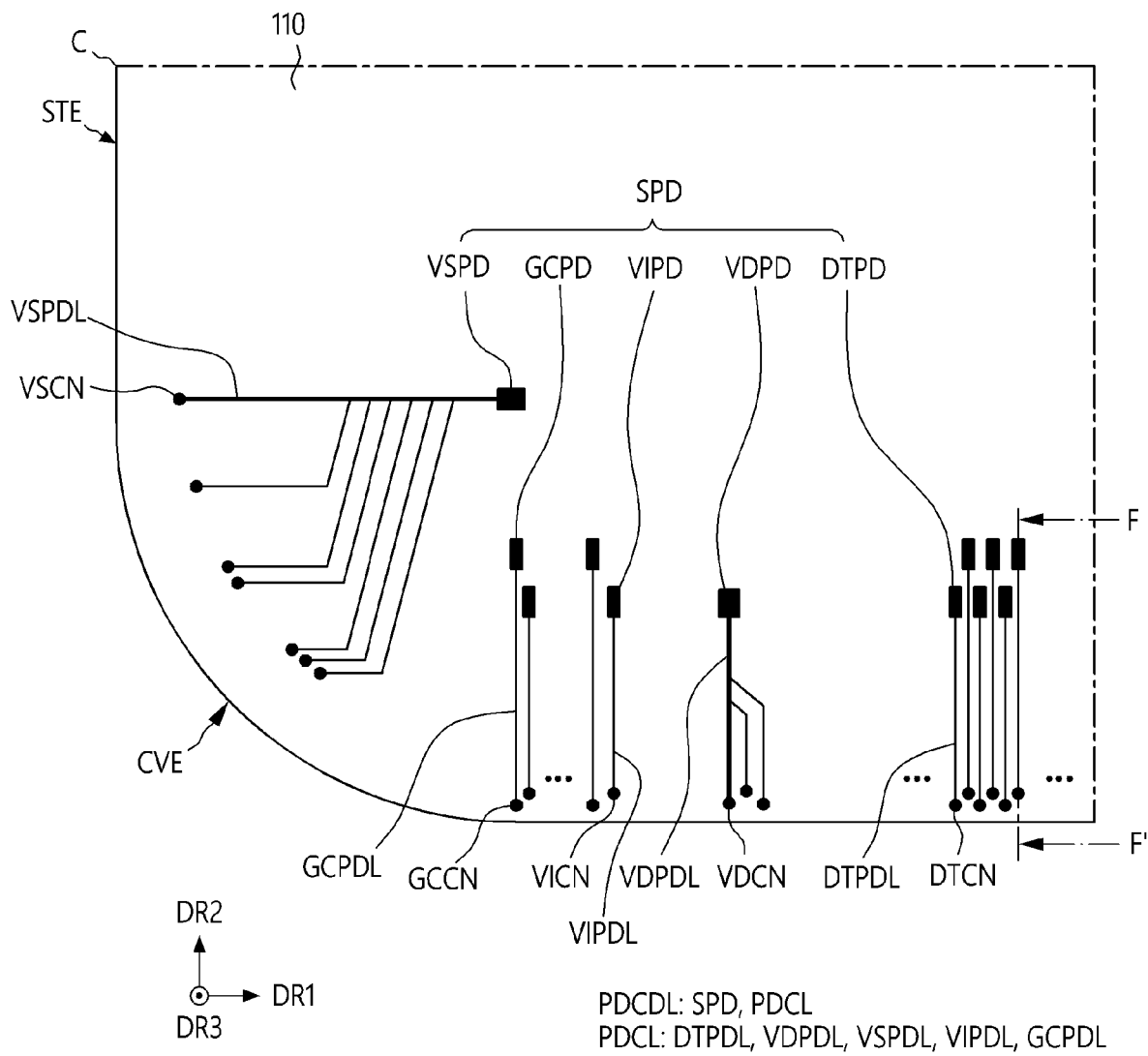
FIG. 11 is a schematic plan diagram illustrating a second surface of a substrate in part C of FIG. 2.

FIG. 10 is a schematic plan diagram illustrating part C of FIG. 2. FIG. 11 is a schematic plan diagram illustrating a second surface of a substrate in part C of FIG. 2.

Referring to FIG. 10, the circuit layer 120 disposed on the first surface of the substrate 110 may be electrically connected to the circuit board 120 disposed on the second surface of the substrate 110 by the first power connection portions VDCN, the second power connection portions VSCN, the data connection portions DTCN, the initialization voltage connection portions VICN, and the gate control connection portions GCCN.

To this end, the first power connection portions VDCN, the second power connection portions VSCN, the data connection portions DTCN, the initialization voltage connection portions VICN, and the gate control connection portions GCCN may penetrate the substrate 110 to be disposed on the second surface opposite to the first surface of the substrate 110 in the same manner as that on the first surface.

Figure 12:
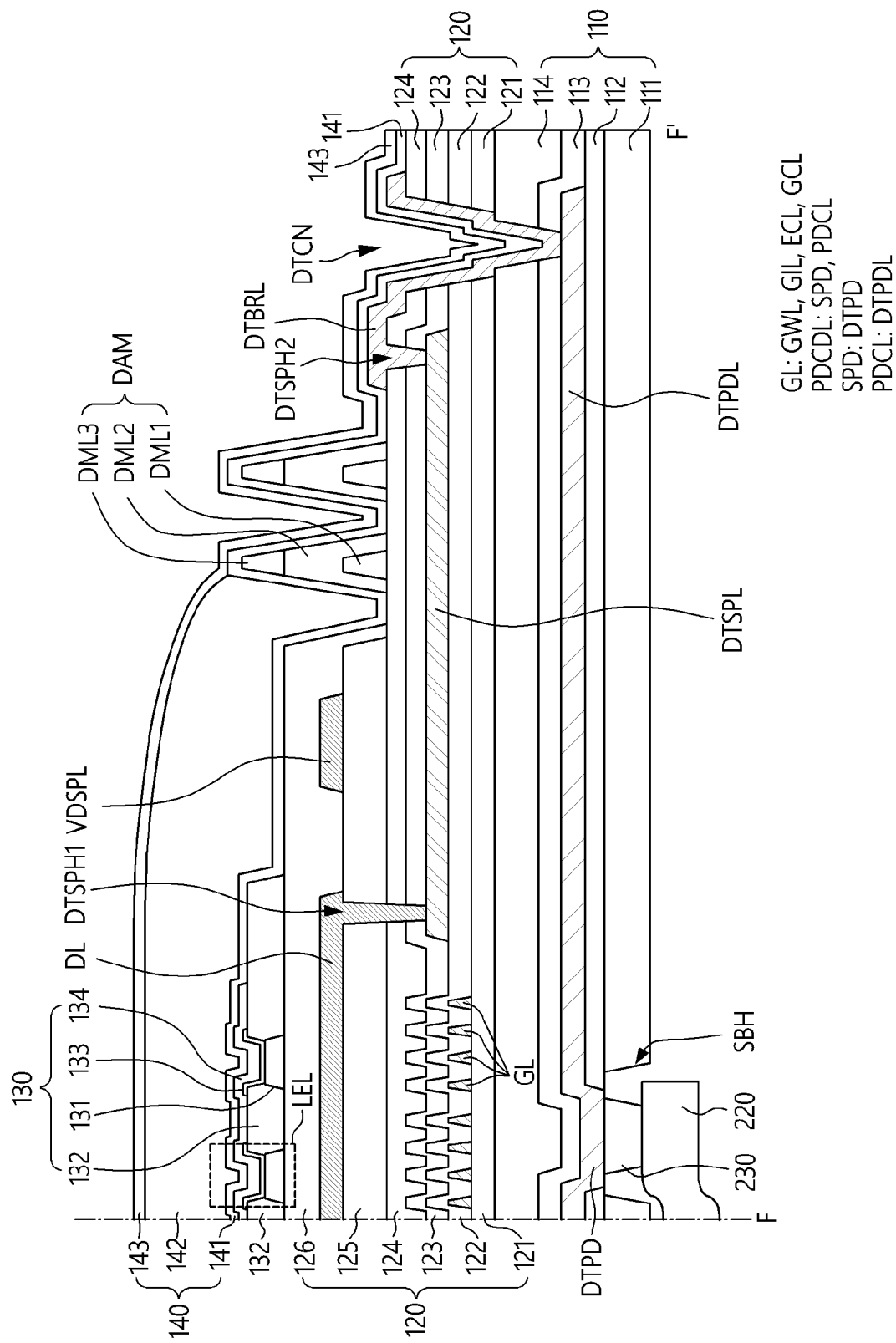
FIG. 12 is a schematic cross-sectional view taken along line F-F' of FIGS. 9 and 11.

Referring to FIG. 12, the display panel 100 of the display device 10 according to one embodiment may include the signal pads SPD and pad lines PDCL disposed on the second surface of the substrate 110. The signal pads SPD and the pad lines PDCL may be included in a pad conductive layer PDCDL of the substrate 110.

The pad lines PDCL may respectively connect the first power connection portions VDCN, the second power connection portions VSCN, the data connection portions DTCN, the initialization voltage connection portions VICN, and the gate control connection portions GCCN to the signal pads SPD.

The signal pads SPD may include a first power pad VDPD for transmitting the first power ELVDD, a second power pad VSPD for transmitting the second power ELVSS, data pads DTPD for transmitting the data signals Vdata, an initialization voltage pad VIPD for transmitting the initialization voltage Vint, and gate driving control pads GCPD for transmitting gate driving control signals.

As shown in FIG. 11, the circuit board 200 may be electrically bonded to the signal pads SPD, and thus may be fixed to the second surface of the substrate 110 and electrically connected to the circuit layer 120.

FIG. 12 is a schematic cross-sectional view taken along line F-F' of FIGS. 9 and 11.

Referring to FIG. 12, the substrate 110 of the display panel 100 of the display device 10 according to one embodiment may include a first support layer 111 including the display area DA and the non-display area NDA, a first barrier layer 112 covering a part of the support layer 111, the pad conductive layer PDCDL disposed on the first support layer 111 and the first barrier layer 112, a second barrier layer 113 covering the pad conductive layer PDCDL, and a second support layer 114 flatly covering the second barrier layer 113.

In other words, the substrate 110 according to one embodiment may include the first support layer 111 and the second support layer 114 facing each other, and the pad conductive layer PDCDL (see FIG. 11) disposed between the first support layer 111 and the second support layer 112.

The first support layer 111 may include the second surface of the substrate 110 on which the circuit board 200 is disposed.

The second support layer 114 may include the first surface of the substrate 110 on which the circuit layer 120 is disposed.

The pad conductive layer PDCDL may include the signal pads (SPD: VDPD) disposed between the first support layer 111 and the second barrier layer 113, and the pad lines PDCL (DTPDL, VDPDL, VSPDL, VIPDL, GCPDL of FIG. 11) disposed between the first barrier layer 112 and the second barrier layer 113 and respectively connected to the signal pads SPD. The signal pads SPD (DTPD, VDPD, VSPD, VIPD, and GCPD in FIG. 11) may be exposed to the outside of the substrate 110 through pad holes penetrating the first support layer 111, and the flexible board portion 220 of the circuit board 200 may be bonded to the signal pads SPD by the conductive adhesive member 230.

The circuit layer 120 may include the buffer layer 121 covering the substrate 110, the first gate insulating layer 122 covering the semiconductor layers CADT, SADT, DADT, CA6, SA6 and DA6 (see FIG. 8) on the buffer layer 121, the second gate insulating layer 123 covering the first gate conductive layer GEDT and GE6 (see FIG. 8) on the first gate insulating layer 122, the first interlayer insulating layer 124 covering the second gate conductive layer CAE (see FIG. 8) on the second gate insulating layer 123, the first planarization layer 125 covering the first source-drain conductive layer ANDE1 (see FIG. 8) on the first interlayer insulating layer 124, and the second planarization layer 126 covering the second source-drain conductive layer ANDE2 (see FIG. 8) on the first planarization layer 125.

Similar to the gate electrode GEDT and GE6 illustrated in FIG. 8, the gate lines GL illustrated in FIG. 12 may be included in the first gate conductive layer on the first gate insulating layer 122.

The circuit layer 120 of the display panel 100 of the display device 10 according to one embodiment may further include a data bridge line DTBRL for electrically connecting the data supply line DTSPL and the data pad line DTPDL.

For example, the data line DL of the display area DA and the first power supply line VDSPL of the non-display area NDA may be included in the second source-drain conductive layer on the first planarization layer 125. Further, in order to prevent a short circuit with the first power supply line VDSPL, the data supply line DTSPL may be included in the first gate conductive layer on the first gate insulating layer 122 or the second gate conductive layer on the second gate insulating layer 123.

The data bridge line DTBRL may be disposed between the dam DAM and the edge of the substrate 110 in the non-display area NDA.

The dam DAM may include two or more dam layers DAM1, DAM2 and DAM3 which are stacked. Each of the two or more dam layers DAM1, DAM2 and DAM3 may be disposed on same layer as one of the first planarization layer 125, the second planarization layer 126, the pixel defining layer 132 and a space layer. The space layer may be disposed on the pixel defining layer 132 and corresponding to portions of the non-emission area NEA. For example, the two or more dam layers may include a first dam layer DAM1 disposed on same layer as the first planarization layer 125, a second dam layer DAM2 disposed on same layer as the second planarization layer 126, and a third dam layer DAM3 disposed on same layer as the pixel defining layer 132.

On the other hand, in order to block permeation of oxygen or moisture, an encapsulation structure formed by bonding between inorganic materials needs to be disposed at the edge of the substrate 110. To this end, the first planarization layer 125, the second planarization layer 126, the pixel defining layer 132, and the second encapsulation layer 142 that are made of an organic material may not extend to the edge of the substrate 110, and may extend from the display area DA to the non-display area NDA to be spaced apart from the dam DAM.

Accordingly, the data bridge line DTBRL may be included in the first source-drain conductive layer on the interlayer insulating layer 124.

The data supply line DTSPL may be electrically connected to the data line DL through a first data supply connection hole DTSPH1 penetrating the first planarization layer 125, the interlayer insulating layer 124, and the second gate insulating layer 123, and may be electrically connected to the data bridge line DTBRL through a second data supply connection hole DTSPH2 penetrating the interlayer insulating layer 124 and the second gate insulating layer 123.

The data bridge line DTBRL may be electrically connected to the data pad line DTPDL through the data connection portion DTCN.

The data connection portion DTCN may include a hole penetrating the interlayer insulating layer 124, the second gate insulating layer 123, the first gate insulating layer 122, and the buffer layer 121, and a hole penetrating the second support layer 114 and the second barrier layer 113 of the substrate 110.

However, the illustration of FIG. 12 is an example, and the data bridge line DTBRL may not be included in the electrical connection between the data supply line DTSPL, the data connection portion DTCN, and the data pad line DTPDL according to one embodiment. The data connection portion DTCN may include a hole overlapping the data supply line DTSPL and penetrating the first gate insulating layer 122 and the buffer layer 121, and a hole penetrating the second support layer 114 and the second barrier layer 113 of the substrate 110.

The gate driver GDR and the second power connection portions VSCN of the display device 10 according to each embodiment will be described.

FIG. 13 is a schematic plan diagram illustrating part G of FIG. 9.

Referring to FIG. 13, the gate lines GL may include the scan write line GWL, the scan initialization line GIL, the emission control line ECL, and the gate control line GCL.

Accordingly, the gate driver GDR may include a first gate driver GDR1 electrically connected to the scan write line GWL, a second gate driver GDR2 electrically connected to the scan initialization line GIL and the gate control line GCL, and a third gate driver GDR3 electrically connected to the emission control line ECL.

The first gate driver GDR1, the second gate driver GDR2, and the third gate driver GDR3 may be arranged side by side in the first direction DR1 between one side of the first direction DR1 of the display area DA and the edge of the substrate 110.

The first gate driver GDR1 may include write stages WRST respectively electrically connected to the scan write lines GWL. Accordingly, the first gate driver GDR1 may include write stage groups WRSTG provided by dividing the write stages WRST.

Each of the write stage groups WRSTG may include two or more consecutive write stages WRST. For example, each of the write stage groups WRSTG may include four consecutive write stages WRST.

The second gate driver GDR2 may include the initialization stages INST electrically connected to the scan initialization line GIL and the gate control line GCL. Each initialization stage INST may be electrically connected to the scan initialization line GIL and the gate control line GCL of each horizontal line.

The second gate driver GDR2 may include initialization stage groups INSTG provided by dividing the initialization stages INST.

Similar to the write stage group WRSTG, each of the initialization stage groups INSTG may include two or more consecutive initialization stages INST. For example, each of the initialization stage groups INSTG may include four consecutive initialization stages INST.

The third gate driver GDR3 may include emission stages EMST respectively electrically connected to the emission control lines ECL. Accordingly, the third gate driver GDR3 may include emission stage groups EMSTG provided by dividing the emission stages EMST.

Similar to the write stage group WRSTG, each of the emission stage groups EMSTG may include two or more consecutive emission stages EMST. For example, each of the emission stage groups EMSTG may include four consecutive emission stages EMST.

The gap between the stage groups STG (WRSTG, INSTG, and EMSTG) are greater than the gap between the consecutive stages ST (WRST, INST, and EMST) included in each stage group STG.

In order to reduce the width and floor area ratio of the non-display area NDA, the gap between some stage groups STG (WRSTG, INSTG, and EMSTG) arranged side by side with the straight edge STE in the edge of the substrate 110 among the stage groups STG (WRSTG, INSTG, and EMSTG) of the gate driver GDR may be relatively small.

The second power supply line VSSPL may overlap a part of the gate driver GDR.

For example, the second power supply line VSSPL may overlap the third gate driver GDR3 of the gate driver GDR that is closest to the edge of the substrate 110.

The circuit layer 120 may include the gate driving control lines GDCL (see FIG. 9) disposed in the non-display area NDA and electrically connected to the stages ST of the gate driver GDR.

Referring to FIG. 13, the gate driving control lines may include gate control supply lines GCSPL1 to GCSPL7 that transmit gate driving control signals to the stages ST, gate voltage supply lines GVSPL1 to GVSPL9 that transmit gate level voltages for generating a gate signal to the stages ST, and gate clock supply lines GCKL1 to GCKL6 that transmit clock signals for generating a gate signal to the stages ST.

Each of the gate control supply lines GCSPL1 to GCSPL7, the gate voltage supply lines GVSPL1 to GVSPL9, and the gate clock supply lines GCKL1 to GCKL6 may be included in the first source-drain conductive layer or the second source-drain conductive layer, and may be spaced apart from the second power connection portions VSCN.

Each of the gate control supply lines GCSPL1 to GCSPL7, the gate voltage supply lines GVSPL1 to GVSPL9, and the gate clock supply lines GCKL1 to GCKL6 may be included in any one of the first source-drain conductive layer and the second source-drain conductive layer, or may be formed of a combination of a part included in the first source-drain conductive layer and another part included in the second source-drain conductive layer.

The gate control supply lines GCSPL1 to GCSPL7 may include a first gate control supply line GCSPL1 that transmits an input carry signal WRCY (see FIG. 14) to the write stages WRST of the first gate driver GDR1, a second gate control supply line GCSPL2 that transmits the input carry signal to the initialization stages INST of the second gate driver GDR2, a third gate control supply line GCSPL3 that transmits a start signal of the first gate driver GDR1, a fourth gate control supply line GCSPL4 that transmits a start signal of the second gate driver GDR2, a fifth gate control supply line GCSPL5 that transmits a start signal of the third gate driver GDR3, a sixth gate control supply line GCSPL6 that transmits a gate-on signal ESR (see FIG. 15), and a seventh gate control signal GCSPL7 that transmits an input carry signal ECRY (see FIG. 15) to the emission stages EMST of the third gate driver GDR3.

The gate voltage supply lines GVSPL1 to GVSPL9 transmit a first gate level voltages GVH (see FIG. 14), a second gate level voltage GVL (see FIGS. 14 and 15), a third gate level voltage GVH' (see FIG. 15), a fourth gate level voltage GVL' (see FIG. 15) that are different from each other to the first gate driver GDR1, the second gate driver GDR2, and the third gate driver GDR3.

For example, the circuit layer 120 may include the first to fifth gate voltage supply lines GVSPL1 to GVSPL5.

The first gate voltage supply line GVSPL1 may overlap or be adjacent to the first gate driver GDR1 and supply the first gate level voltage GVH.

The second gate voltage supply line GVSPL2 may overlap or be adjacent to the first gate driver GDR1 and transmit the second gate level voltage GVL different from the first gate level voltage GVH.

The third gate voltage supply line GVSPL3 may overlap the second gate driver GDR2 and supply the third gate level voltage GVH'.

The fourth gate voltage supply line GVSPLA may overlap the second gate driver GDR2 and supply the fourth gate level voltage GVL'.

The fourth gate voltage supply line GVSPLA may be included in the second source-drain conductive layer.

The fifth gate voltage supply line GVSPL5 may overlap the second gate driver GDR2 and supply the first gate level voltage GVH.

The fifth gate voltage supply line GVSPL5 may be included in the first source-drain conductive layer, and may overlap at least a part of the fourth gate voltage supply line GVSPL4.

Further, the circuit layer 120 may further include sixth to ninth gate voltage supply lines GVSPL6 to 9.

The sixth gate voltage supply line GVSPL6 may overlap or be adjacent to the second gate driver GDR2 and transmit the second gate level voltage GVL.

The seventh gate voltage supply line GVSPL7 may overlap or be adjacent to the third gate driver GDR3 and transmit the second gate level voltage GVL.

The eighth gate voltage supply line GVSPL8 may overlap or be adjacent to the third gate driver GDR3 and supply the first gate level voltage GVH.

The circuit layer 120 may further include a ninth gate voltage supply line GVSPL9 that overlaps the eighth gate voltage supply line GVSPL8 and transmits the second gate level voltage GVL.

The gate clock supply lines GCKL1 to GCKL6 may include a first gate clock supply line GCKL1 and a second gate clock supply line GCKL2 that transmit a first gate clock signal CLK1 (see FIG. 14) and a second gate clock signal CLK2 (see FIG. 14) to the first gate driver GDR1, a third gate clock supply line GCKL3 and a fourth gate clock supply line GCKL4 that transmit a third gate clock signal and a fourth gate clock signal to the second gate driver GDR2, and a fifth gate clock supply line GCKL5 and a sixth gate clock supply line GCKL6 that transmit a fifth gate clock signal CLK5 (see FIG. 15) and a sixth gate clock signal CLK6 (see FIG. 15) to the third gate driver GDR3.

However, the illustration of FIG. 13 is only an example, and the circuit layer 120 of one embodiment is not limited to the illustration of FIG. 13.

Figure 14:
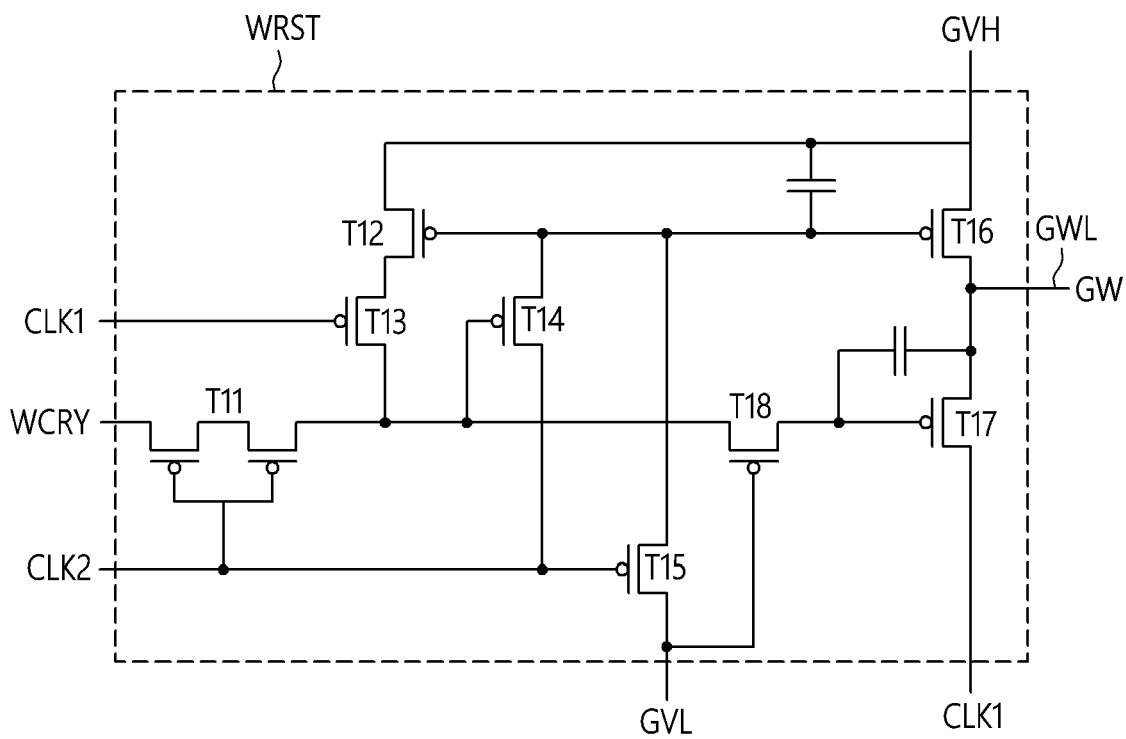
FIG. 14 is a schematic diagram of an equivalent circuit illustrating an example of one write stage of the first gate driver of FIG. 13.

FIG. 14 is a schematic diagram of an equivalent circuit illustrating an example of one write stage of the first gate driver of FIG. 13.

Referring to FIG. 14, one write stage WRST of the gate driver GDR according to one embodiment may include eleventh to eighteenth transistors ST11 to ST18.

The sixteenth transistor ST16 outputs the scan write signal GW at the first gate level voltage GVH, and the seventeenth transistor ST17 outputs the scan write signal GW at the second gate level voltage GVL. The fourteenth transistor ST14 and the fifteenth transistor ST15 control the output through the sixteenth transistor ST16.

The eleventh transistor ST11, the twelfth transistor ST12, and the thirteenth transistor ST13 control the output through the seventeenth transistor ST17.

The eighteenth transistor ST18 controls the connection between the eleventh transistor ST11, the twelfth transistor ST12, the thirteenth transistor ST13, and the seventeenth transistor ST17.

The eleventh transistor ST11 is turned on by the second gate clock signal CLK2. In case that the eleventh transistor ST11 is turned on, a write input carry signal WCRY of the write stage WRST may be transmitted to the second electrode of the thirteenth transistor ST13, the gate electrode of the fourteenth transistor ST14, and the first electrode of the eighteenth transistor ST18.

The fourteenth transistor ST14 is turned on by the write input carry signal WCRY. The second gate clock signal CLK2 may be applied to the first electrode of the fourteenth transistor ST14, and the first gate level voltage GVH may be applied to the second electrode of the fourteenth transistor ST14 through a capacitor. Accordingly, in case that the fourteenth transistor ST14 is turned on, the potential of the second electrode of the fourteenth transistor ST14 may be changed to the high voltage of the clock signal.

The twelfth transistor ST12 may be turned on according to the potential of the second electrode of the fourteenth transistor ST14. The first gate level voltage GVH may be applied to the first electrode of the twelfth transistor ST12, and the second electrode of the twelfth transistor ST12 may be connected to the first electrode of the thirteenth transistor ST13.

The thirteenth transistor ST13 is turned on according to the first gate clock signal CLK1.

Accordingly, in case that the potential of the second electrode of the fourteenth transistor ST14 has a low voltage and the first gate clock signal CLK1 has a low voltage, the potential of the second electrode of the thirteenth transistor ST13 may be changed to the first gate level voltage GVH.

The fifteenth transistor ST15 may be turned on in case that the second gate clock signal CLK2 has a low voltage.

The sixteenth transistor ST16 may be turned on in case that the fifteenth transistor ST15 is turned on and the potential of the second electrode of the fourteenth transistor ST14 becomes the second gate level voltage GVL. At this time, the output terminal of the write stage WRST may output the first gate level voltage GVH.

Figure 15:
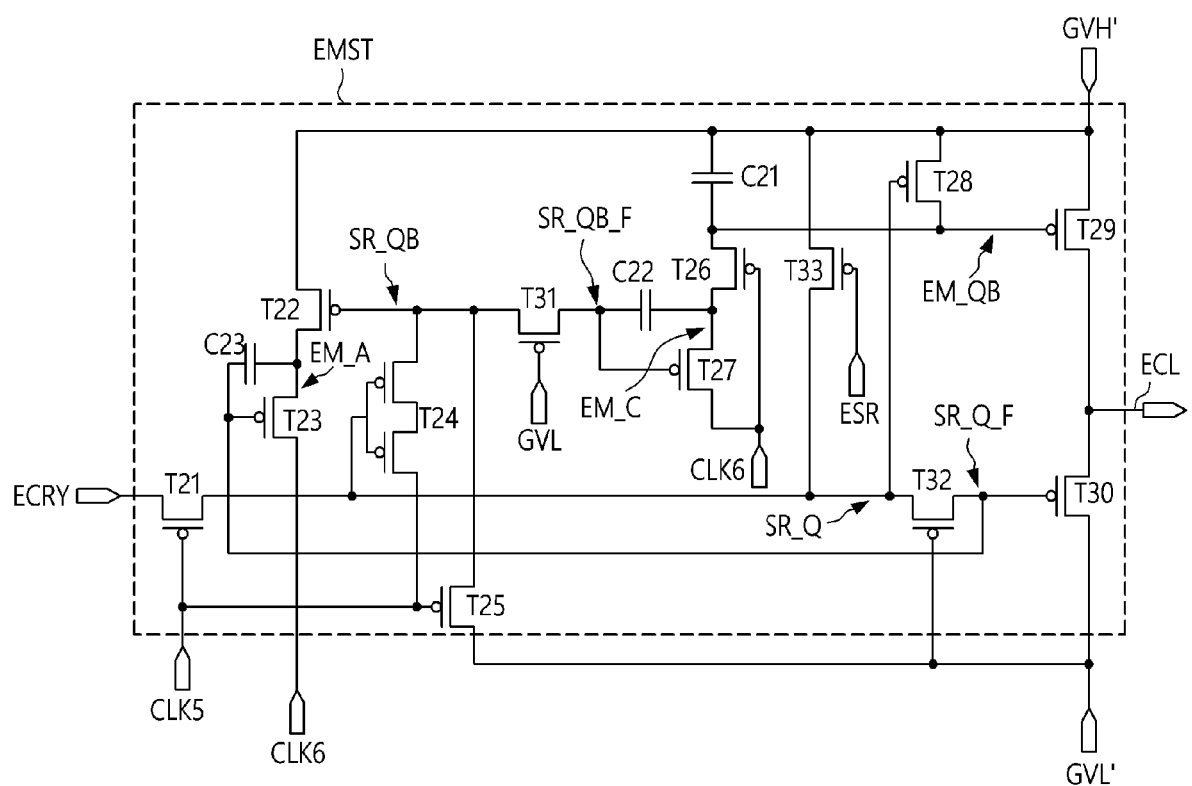
FIG. 15 is a schematic diagram of an equivalent circuit illustrating an example of one emission stage of the third gate driver of FIG. 13.

FIG. 15 is a schematic diagram of an equivalent circuit illustrating an example of one emission stage of the third gate driver of FIG. 13.

Referring to FIG. 15, one emission stage EMST of the gate driver GDR according to one embodiment may include twenty-first to thirty-third transistors ST21 to ST33.

The twenty-ninth transistor ST29 outputs the emission control signal EC at the third gate level voltage GVH'.

The output of the twenty-ninth transistor ST29 may be controlled by a voltage of a first node EM_QB.

The twenty-sixth transistor ST26, the twenty-seventh transistor ST27, and the twenty-eighth transistor ST28 control the voltage of the first node EM_QB.

The twenty-sixth transistor ST26 and the twenty-seventh transistor ST27 are controlled by a voltage of a third-first node SR_QB_F.

Since the third-first node SR_QB_F is connected to a third node SR_QB through the thirty-first transistor ST31, the twenty-sixth transistor ST26 and the twenty-seventh transistor ST27 may be controlled by the voltage of the third node SR_QB.

The twenty-fourth transistor ST24 and the twenty-fifth transistor ST25 control the voltage of the third node SR_QB.

The thirtieth transistor ST30 outputs the emission control signal EC at the fourth gate level voltage GVL'.

The output of the thirtieth transistor ST30 may be controlled by a voltage of a second node SR_Q.

The thirty-second transistor ST32 controls the connection between the thirtieth transistor ST30 and the second node SR_Q.

The third gate level voltage GVH' is applied to the first electrode of the twenty-ninth transistor ST29, and the second electrode thereof is connected to the output terminal of the emission stage EMST. Accordingly, in case that the potential of the first node EM_QB has a low voltage, the emission control signal EC may be outputted at the third gate level voltage GVH' through the twenty-ninth transistor ST29.

The fourth gate level voltage GVL' is applied to the first electrode of the thirtieth transistor ST30, and the second electrode thereof is connected to the output terminal of the emission stage EMST. Accordingly, in case that a potential of a second-first node SR_Q_F has a low voltage, the emission control signal EC may be outputted at the fourth gate level voltage GVL' through the thirtieth transistor ST30. On the other hand, in case that the potential of the second-first node SR_Q_F has a high voltage, the thirtieth transistor ST30 has no output.

The third gate level voltage GVH' is applied to the first electrode of the twenty-eighth transistor ST28, the second electrode thereof is connected to the first node EM_QB, and the gate electrode thereof is connected to the second node SR_Q. Accordingly, in case that the second node SR_Q has a low voltage, the third gate level voltage GVH' may be transmitted to the first node EM_QB through the twenty-eighth transistor ST28.

The twenty-first capacitor C21 may store the voltage of the first node EM_QB.

A sixth gate clock signal CLK6 may be applied to the gate electrode of the twenty-sixth transistor ST26, the first electrode thereof may be connected to a fourth node EM_C, and the second electrode thereof may be connected to the first node EM_QB. FIG. 15 may also include a twenty-second capacitor C22 and a twenty-third capacitor C23.

The gate electrode of the twenty-seventh transistor ST27 is connected to the third-first node SR_QB_F, the sixth gate clock signal CLK6 is applied to the first electrode thereof, and the second electrode thereof is connected to the fourth node EM_C. Due to the twenty-sixth transistor ST26 and twenty-seventh transistor ST27, in case that the potential of the third node SR_QB and the sixth gate clock signal CLK6 have a low voltage, the potential of the first node EM_QB may be changed to the low voltage of the sixth gate clock signal CLK6.

A fifth gate clock signal CLK5 is applied to the gate electrode of the twenty-first transistor ST21, the emission carry input signal ECRY is inputted to the first electrode thereof, and the second electrode thereof is connected to the second node SR_Q. Accordingly, due to the twenty-first transistor ST21, in case that the fifth gate clock signal CLK5 has a low voltage, the potential of the second node SR_Q may be changed to the emission carry input signal ECRY.

Since the fourth gate level voltage GVL' is applied to the gate electrode of the thirty-second transistor ST32, the potential of the second-third node SR_Q_F may be maintained at the same level as the potential of the second node SR_Q due to the thirty-second transistor ST32 in a turn-on state.

The gate-on signal ESR is applied to the gate electrode of the thirty-third transistor ST33, the third gate level voltage GVH' is applied to the first electrode thereof, and the second electrode thereof is connected to the second node SR_Q. In this way, due to the thirty-third transistor ST33 maintained in the turn-on state, the potential of the second node SR_Q may be maintained at the third gate level voltage GVH'.

The gate electrode of the twenty-second transistor ST22 is connected to the third node SR_QB, the third gate level voltage GVH' is applied to the first electrode thereof, and the second electrode thereof is connected to a fifth node EM_A.

The gate electrode of the twenty-third transistor ST23 is connected to the second-first node SR_Q_F, the sixth gate clock signal CLK6 is applied to the first electrode thereof, and the second electrode thereof is connected to the fifth node EM_A.

Due to the twenty-second transistor ST22 and the twenty-third transistor ST23, in case that the potentials of both the sixth gate clock signal CLK6 and the third node SR_QB have a low voltage, the potential of the second node SR_Q may be changed to a high voltage.

The gate electrode of the twenty-fourth transistor ST24 is connected to the second node SR_Q, the fifth gate clock signal CLK5 is applied to the first electrode thereof, and the second electrode thereof is connected to the third node SR_QB. The twenty-fourth transistor ST24 may include two sub-transistors connected in series.

The fifth gate clock signal CLK5 is applied to the gate electrode of the twenty-fifth transistor ST25, the fourth gate level voltage GVL' is applied to the first electrode thereof, and the second electrode thereof is connected to the third node SR_QB.

Accordingly, due to the twenty-fifth transistor ST25, the potential of the third node SR_QB may become the fourth gate level voltage GVL'. Further, due to the twenty-fourth transistor ST24, in case that the potential of the second node SR_Q has a low voltage, the voltage of the third node SR_QB may be changed to the voltage of the fifth gate clock signal CLK5.

Further, since the initialization stage INST of the second gate driver GDR2 is similar to the emission stage EMST illustrated in FIG. 15, the redundant description will be omitted below.

In case that the gate control signal GC is a gate signal for driving turn-on and turn-off of a P-type MOSFET similar to the scan write signal GW, the scan initialization signal GI, and the emission control signal EC, the third gate level voltage GVH' and the fourth gate level voltage GVL' may be the same as the first gate level voltage GVH and the second gate level voltage GVL, respectively.

On the other hand, in case that the gate control signal GC is a gate signal for driving turn-on and turn-off of an N-type MOSFET unlike the scan write signal GW, the scan initialization signal GI, and the emission control signal EC, the third gate level voltage GVH' and the fourth gate level voltage GVL' that are different from the first gate level voltage GVH and the second gate level voltage GVL, respectively, may be supplied to the second gate driver GDR2 in order to generate the gate control signal GC.

Figure 16:
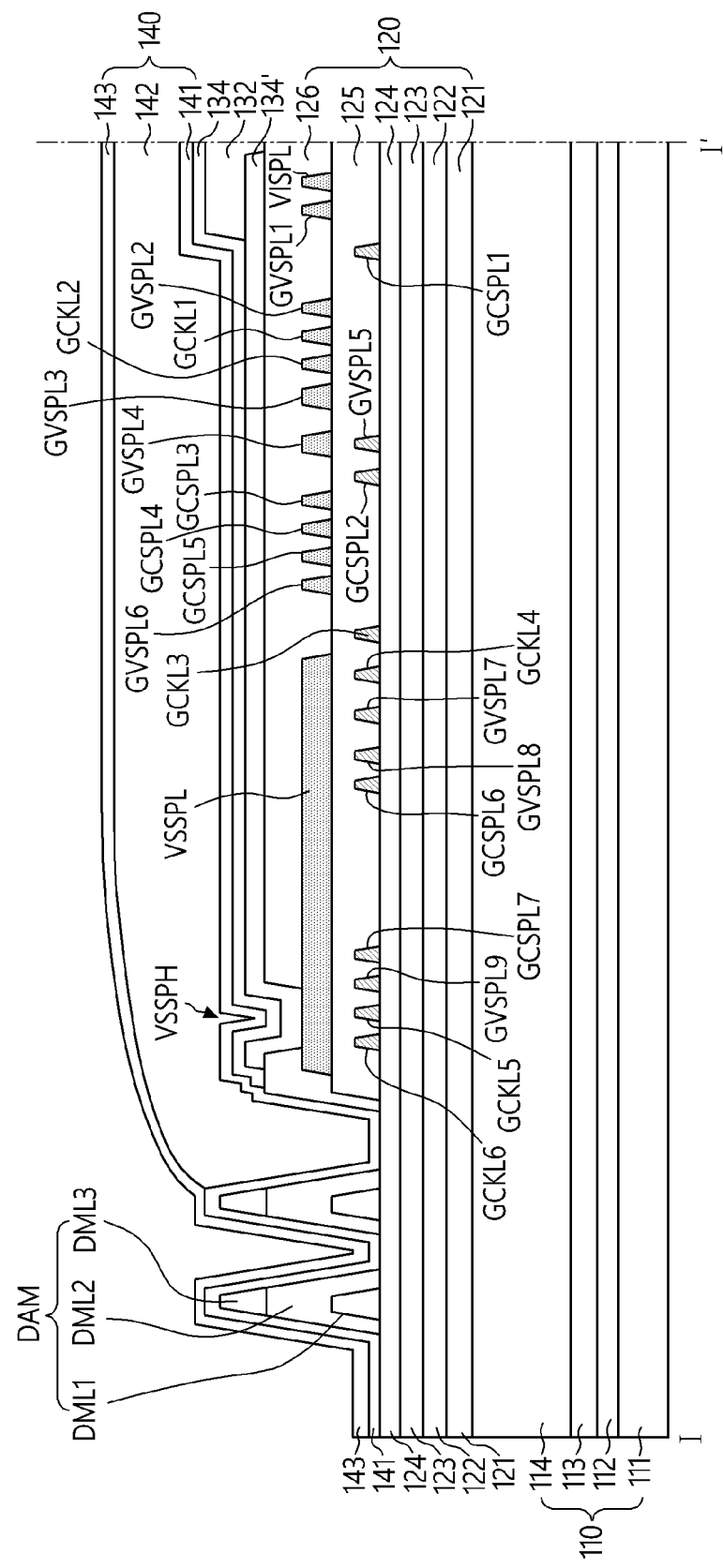
FIG. 16 is a schematic cross-sectional view taken along line I-I' of FIG. 13.

FIG. 16 is a schematic cross-sectional view taken along line I-I' of FIG. 13.

Referring to FIG. 16, the second power supply line VSSPL according to one embodiment may be included in the second source-drain conductive layer on the first planarization layer 125.

Among the gate drive control lines GDCL (GCSPL1 to GCSPL7, GVSPL1 to GVSPL9, and GCKL1 to GCKL6), some lines overlapping the second power supply line VSSPL may be included in the first source-drain conductive layer on the interlayer insulating layer 124.

For example, the fourth to sixth gate clock supply lines GCKL4 to GCKL6, the seventh to ninth gate voltage supply lines GVSPL7 to GVSPL9, and the sixth and seventh gate control supply lines GCSPL6 and GCSPL7 may be included in the first source-drain conductive layer.

In the separation area between the stage groups STG adjacent to the straight edge STE in the edge of the substrate 110, among the gate driving control lines GDCL (GCSPL1 to GCSPL7, GVSPL1 to GVSPL9, and GCKL1 to GCKL6), the first to third gate clock supply lines GCKL1 to GCKL3, the first to fourth gate voltage supply lines GVSPL1 to GVSPL4, and the third and fourth gate control supply lines GCSPL3 and GCSPL4 may be included in the second source-drain layer. Further, among the gate driving control lines GDCL (GCSPL1 to GCSPL7, GVSPL1 to GVSPL9, and GCKL1 to GCKL6), the first and second gate control supply lines GCSPL1 and GCSPL2, and the fifth gate voltage supply line GVSPL5 that are the other lines may be included in the first source-drain conductive layer.

In accordance with one embodiment, the circuit layer 120 may further include a cathode connection electrode 134' disposed on the second planarization layer 126 of the non-display area NDA.

The cathode connection electrode 134' may be electrically connected to the second power supply line VSSPL through the connection hole penetrating the second planarization layer 126.

The cathode electrode 134 may be electrically connected to the cathode connection electrode 134' through a second power supply hole VSSPH.

Accordingly, the cathode electrode 134 may be electrically connected to the second power supply line VSSPL through the cathode connection electrode 134' and the second power supply hole VSSPH.

Due to the cathode connection electrode 134', the resistance between the second power supply line VSSPL and the cathode electrode 134 may be lowered, so that the power consumption of the display device 10 may be reduced.

In accordance with one embodiment, the second power connection portions VSCN for electrical connection between the second power supply line VSSPL and the circuit board 200 are adjacent to the curved corner CVE in the edge of the substrate 110 and disposed between the stage groups STG' of the gate driver GDR.

Figure 17:
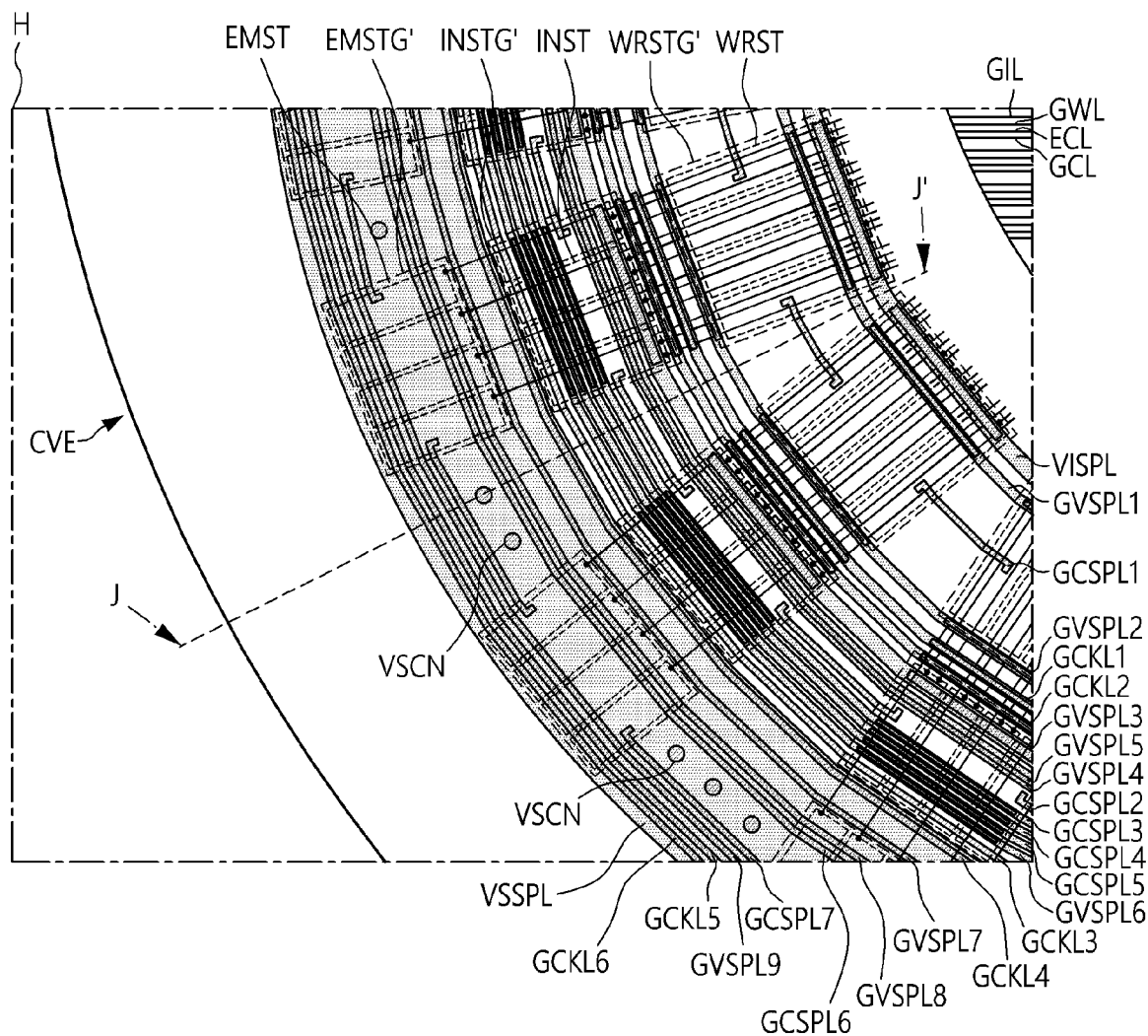
FIG. 17 is a schematic plan diagram showing part H of FIG. 9 according to a first embodiment.
Figure 18:
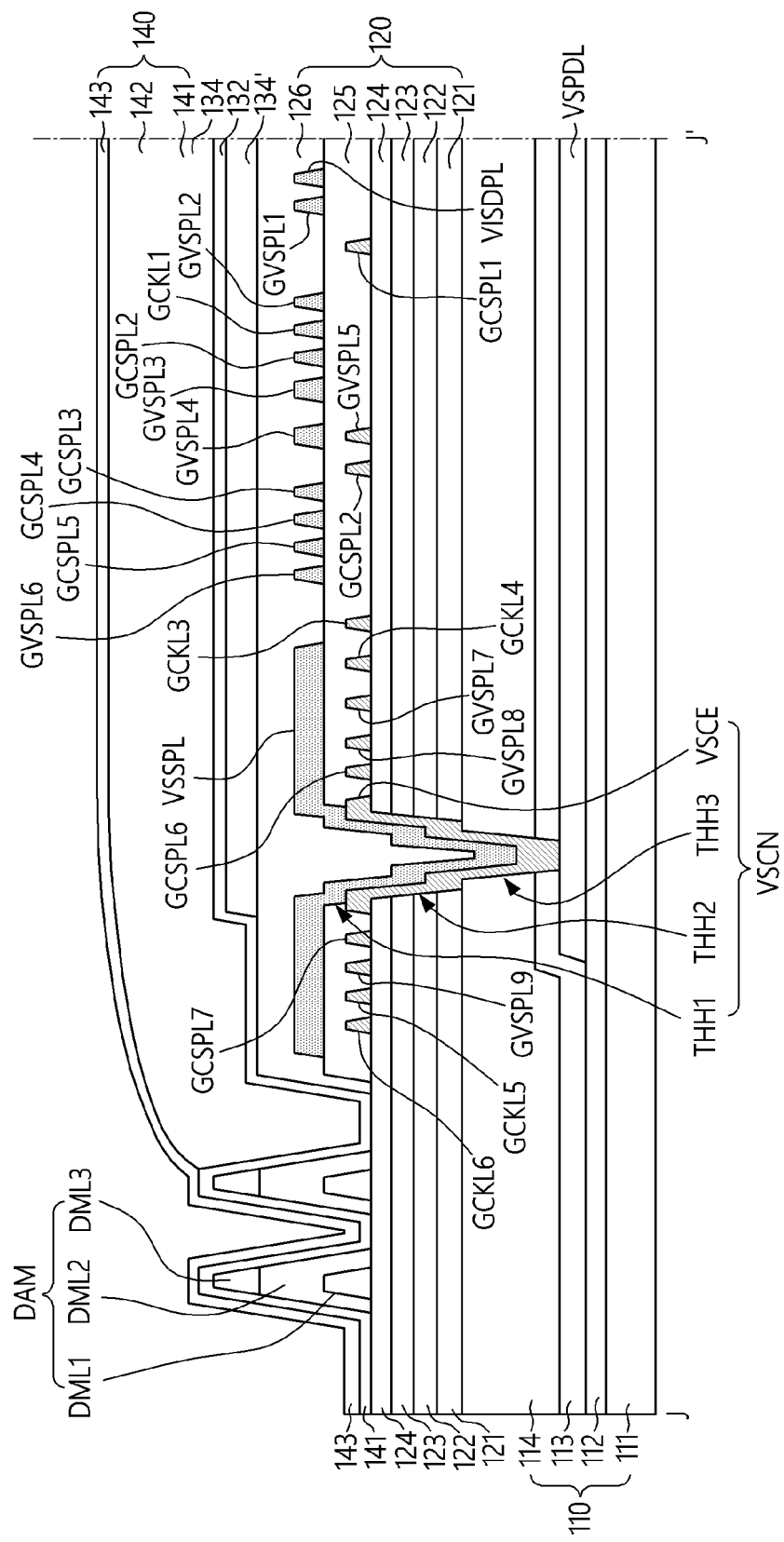
FIG. 18 is a schematic cross-sectional view taken along line J-J' of FIG. 17.

FIG. 17 is a schematic plan diagram showing part H of FIG. 9 according to a first embodiment. FIG. 18 is a schematic cross-sectional view taken along line J-J' of FIG. 17.

Referring to FIG. 17, the second power supply line VSSPL of the circuit layer 120 of the display device 10 according to the first embodiment overlaps the third gate driver GDR closest to the edge of the substrate 110, and the second power connection portions VSCN are disposed between some emission stage groups EMSTG' adjacent to the curved corner CVE of the substrate 110 among the emission stage groups EMSTG of the third gate driver GDR3.

For example, as illustrated in FIG. 13, in order to increase the floor area ratio of the non-display area NDA, the gap between the other emission stage groups EMSTG adjacent to the straight edge in the edge of the substrate 110 is relatively small. Since, however, some emission stage groups EMSTG' adjacent to the curved corner CVE of the substrate 110 are arranged in a diagonal direction oblique to the first direction DR1 and the second direction DR2 according to the curvature of the curved corner CVE of the substrate 110, the gap between some emission stage groups EMSTG' adjacent to the curved corner CVE of the substrate 110 may be greater than the width of the second power connection portion VSCN. Accordingly, even if a part of the non-display area NDA is not separately allocated, the second power connection portions VSCN may be disposed between some emission stage groups EMSTG' adjacent to the curved corner CVE of the substrate 110.

In this way, the second power connection portions VSCN spaced apart from each other may be disposed without allocating a part of the non-display area NDA adjacent to the curved corner CVE of the substrate 110 to the arrangement of the second power connection portions VSCN. Therefore, it is possible to reduce the width of the non-display area NDA, and also possible to reduce heat generation caused by the application of the second power ELVSS.

Referring to FIG. 18, the second power supply connection portion VSCN may be spaced apart from the gate driving control lines GDCL electrically connected to the gate driver GDR, for example, the gate control supply lines GCSPL1 to GCSPL7, the gate voltage supply lines GVSPL1 to GVSPL9, and the gate clock supply lines GCKL1 to GCKL6. Accordingly, a short-circuit defect between the gate driving control lines GDCL and the second power ELVSS may be prevented.

Each of the second power connection portions VSCN may include a first through hole THH1 penetrating the first planarization layer 125, a second through hole THH2 penetrating the interlayer insulating layer 124, the second gate insulating layer 123, the first gate insulating layer 122, and the buffer layer 121, a third through hole THH3 penetrating the second support layer 114 and the second barrier layer 113, and a second power supply connection electrode VSCE disposed on the interlayer insulating layer 124. The second power supply connection electrode VSCE may be electrically connected to the second power supply line VSSPL through the first through hole THH1, and may be electrically connected to the second power pad line VSPDL through the second through hole THH2 and the third through hole THH3.

Figure 19:
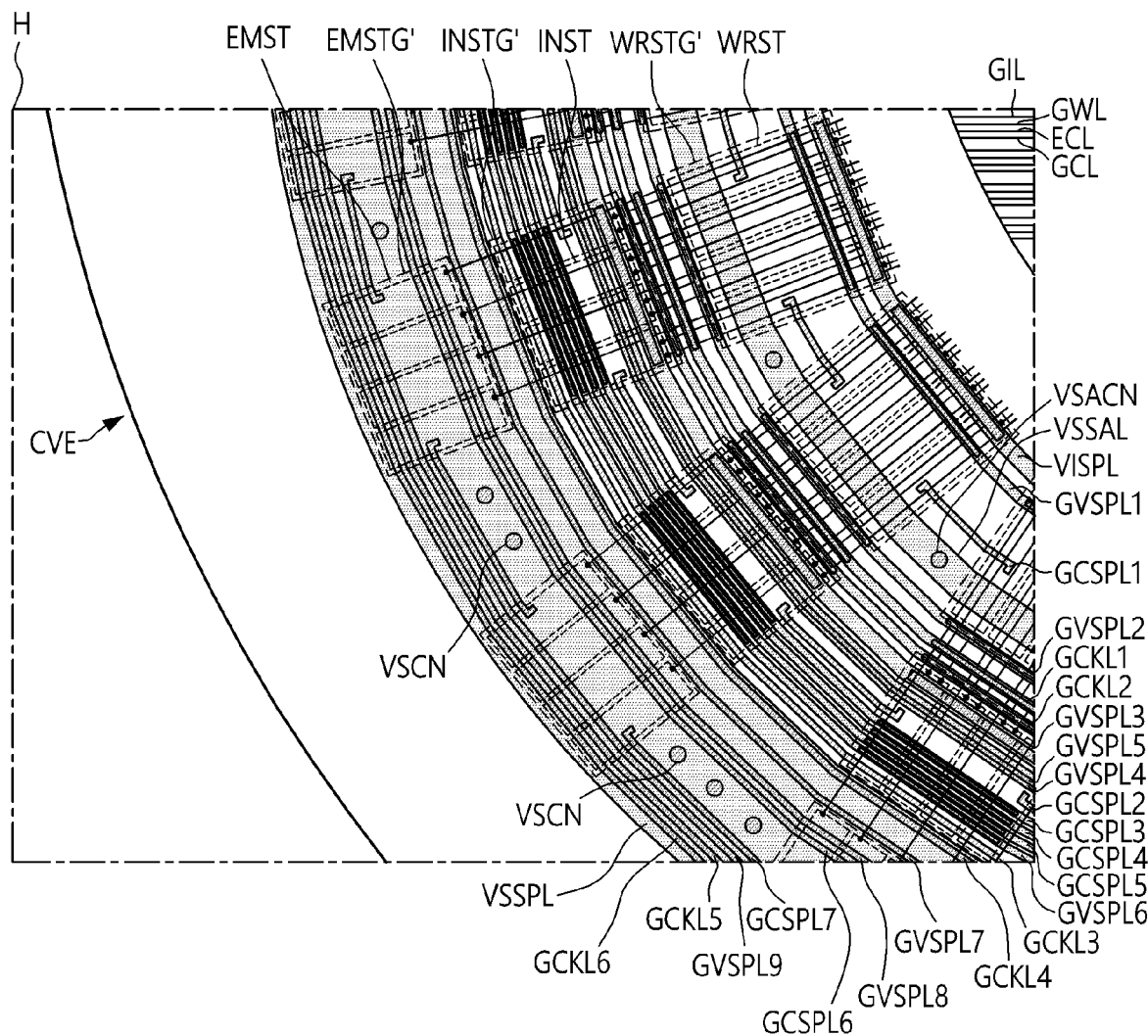
FIG. 19 is a schematic plan diagram illustrating part H of FIG. 9 according to a second embodiment.

FIG. 19 is a schematic plan diagram illustrating part H of FIG. 9 according to a second embodiment.

Referring to FIG. 19, the circuit layer 120 of the display device 10 according to the second embodiment is substantially the same as that according to the first embodiment illustrated in FIGS. 17 and 18 except that it further may include a second power supply additional line VSSAL overlapping a part of the first gate driver GDR1, so that the redundant description will be omitted below.

The second power supply additional line VSSAL may be electrically connected to the second power pad line VSPDL through second power additional connection portions VSACN.

The second power connection portions VSACN may be disposed between some write stage groups WRSTG' adjacent to the curved corner CVE of the substrate 110 among the write stage groups WRSTG and WRSTG' of the first gate driver GDR1.

Since each of the second power additional connection portions VSCN is substantially the same as the second power connection portion VSCN illustrated in FIG. 18, the redundant description will be omitted.

In accordance with the second embodiment, the resistance between the second power supply line VSSPL and the second power pad line VSPDL may be reduced by the second power additional connection line VSACN and the second power additional connection portions VSACN.

Therefore, it may be advantageous to reduce the power consumption of the display device 10 and improve the display quality.

Figure 20:
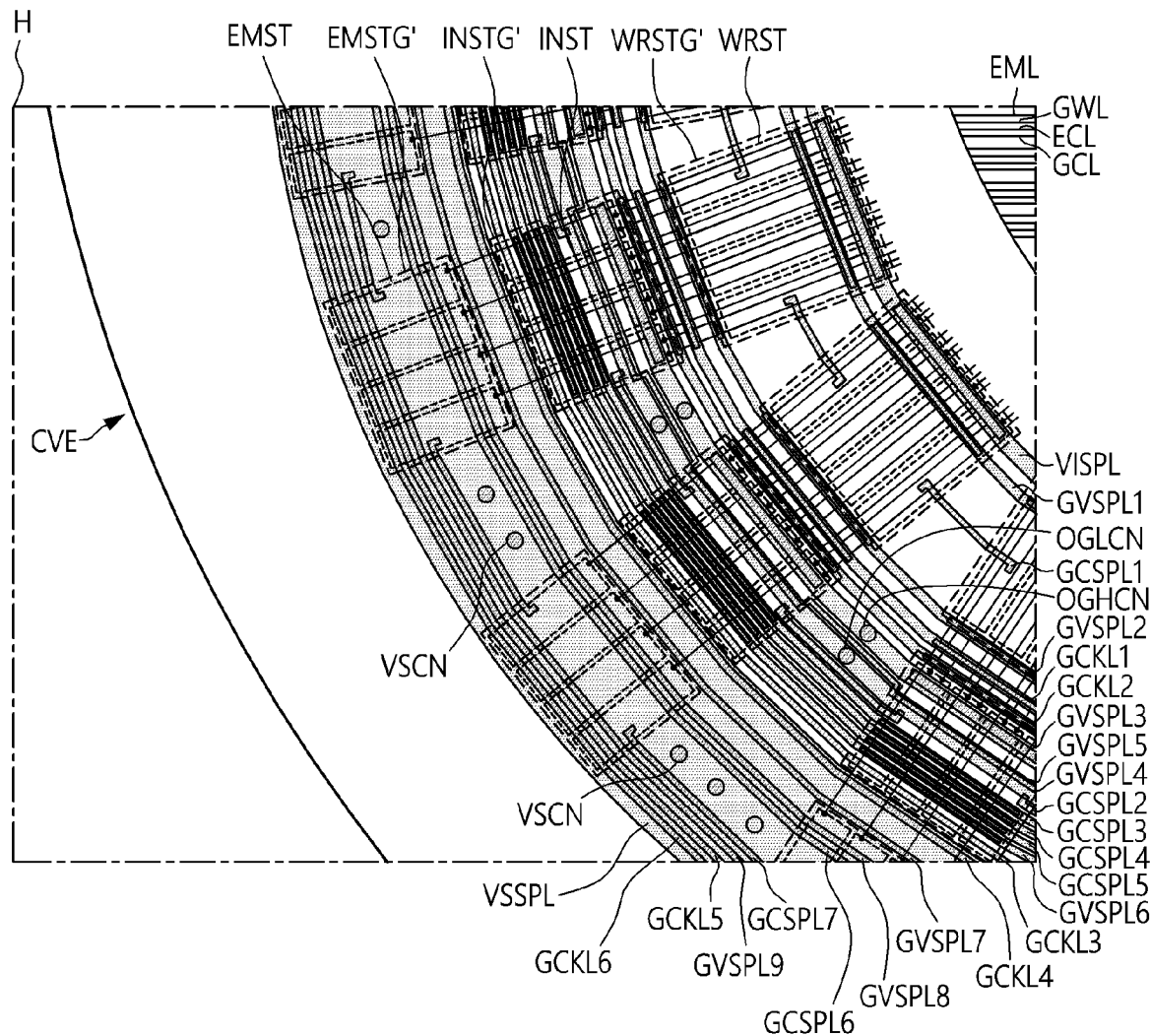
FIG. 20 is a schematic plan diagram illustrating part H of FIG. 9 according to a third embodiment.

FIG. 20 is a schematic plan diagram illustrating part H of FIG. 9 according to a third embodiment.

Referring to FIG. 20, the third embodiment is substantially the same as the first embodiment illustrated in FIGS. 17 and 18 or the second embodiment illustrated in FIG. 19 except that the third gate voltage supply line GVSPL3 and the fourth gate voltage supply line GVSPL4 of the circuit layer 120 of the display device 10 are electrically connected to the circuit substrate 200 through a third gate voltage connection portion OGHCN and a fourth gate voltage connection portion OGLCN, respectively, so that the redundant description will be omitted below.

The third embodiment may be more advantageously applied to a structure in which the third gate voltage supply line GVSPL3 and the fourth gate voltage supply line GVSPL4 transmit the third gate level voltage GVH' and the fourth gate level voltage GVL' that are different from the first gate level voltage GVH and the second gate level voltage GVL transmitted by the first gate voltage supply line GVSPL1, the second gate voltage supply line GVSPL2, and the fifth to ninth gate voltage supply lines GVSPL5 to GVSPL9.

For example, in case that the third gate level voltage GVH' and the fourth gate level voltage GVL' are different from the first gate level voltage GVH and the second gate level voltage GVL, the connection portions for transmitting the third gate level voltage GVH' and the fourth gate level voltage GVL' need to be provided separately from the connection portions for transmitting the first gate level voltage GVH and the second gate level voltage GVL. For example, since the types of the connection portions increase, the width of the non-display area NDA may increase.

In order to prevent this phenomenon, in accordance with the third embodiment, while considering that the third gate voltage supply line GVSPL3 and the fourth gate voltage supply line GVSPL4 overlap the second gate driver GDR2, the third gate voltage connection portion OGHCN for electrical connection between the third gate voltage supply line GVSPL3 and the circuit board 200, and the fourth gate voltage connection portion OGLCN for electrical connection between the fourth gate voltage supply line GVSPL4 and the circuit board 200 may be disposed between some initialization stage groups INSTG' adjacent to the curved corner CVE of the substrate 110 among the initialization stage groups INSTG and INSTG' of the second gate driver GDR2.

In this way, it is possible to supply a larger number of gate level voltages to the gate driver GDR and prevent an increase in the width of the non-display area NDA.

Since the third gate voltage connection portion OGHCN and the fourth gate voltage connection portion OGLCN have substantially the same structure as that of the second power connection portion VSCN illustrated in FIG. 17, the redundant description will be omitted below.

In accordance with the third embodiment, in order to secure an area where the third gate voltage connection portion OGHCN and the fourth gate voltage connection portion OGLCN will be disposed, the fifth gate voltage supply line GVSPL5 may include a curved shape in the separation area between the initialization stage groups INSTG'.

Figure 21:
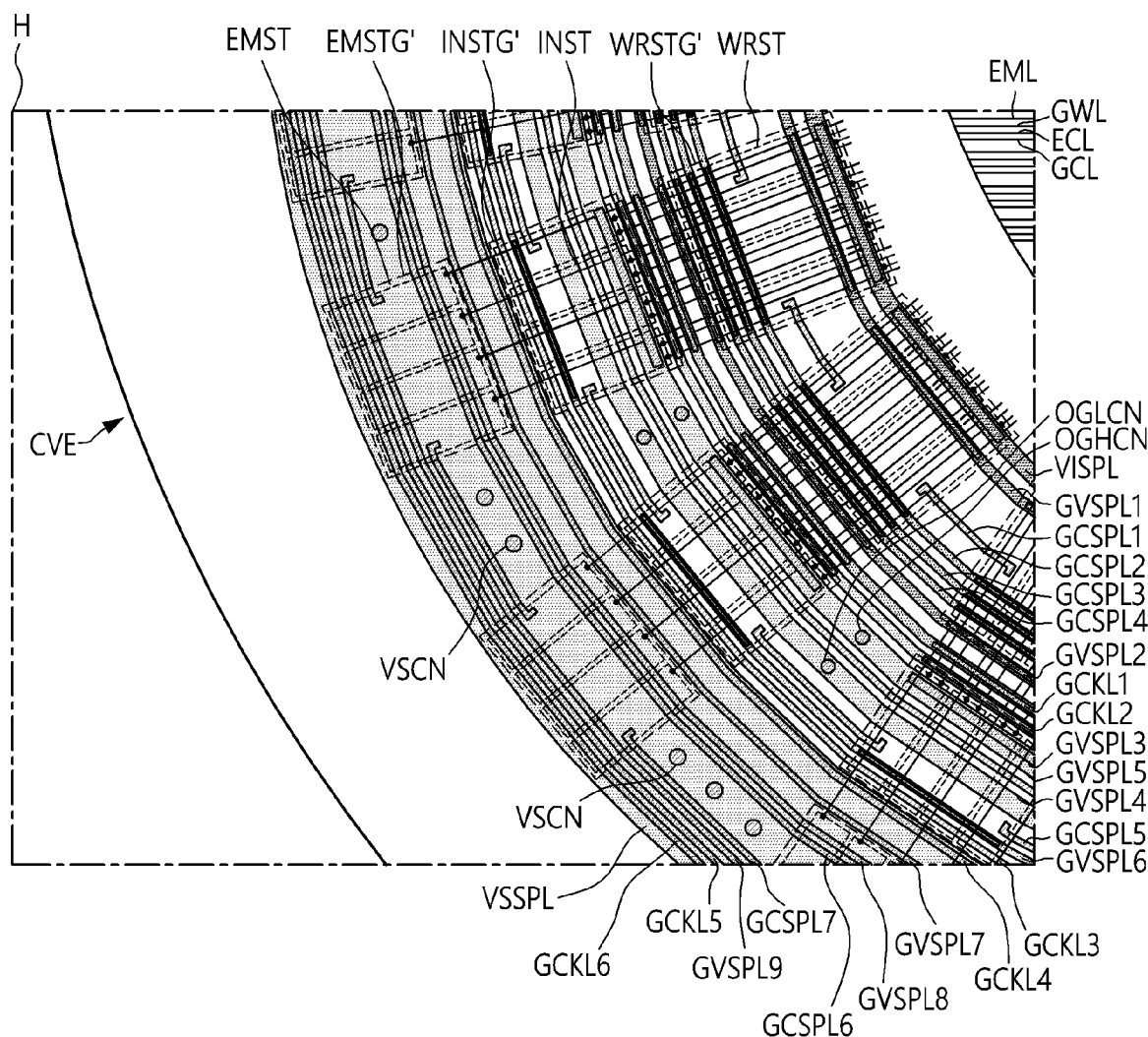
FIG. 21 is a schematic plan diagram showing part H of FIG. 9 according to a fourth embodiment.

FIG. 21 is a schematic plan diagram showing part H of FIG. 9 according to a fourth embodiment.

Referring to FIG. 21, the display device 10 according to the fourth embodiment is substantially the same as the display device 10 according to the third embodiment of FIG. 20 except that the third to fifth gate control supply lines GCSPL3 to GCSPL5 overlap the first gate driver GDR1 without overlapping the second gate driver GDR2, so that the redundant description will be omitted below.

In case that the third gate voltage connection portion OGHCN and the fourth gate voltage connection portion OGLCN are disposed in the second gate driver GDR2, each of the third gate voltage connection portion OGHCN and the fourth gate voltage connection portion OGLCN needs to have a width greater than or equal to a threshold, so that the gap between the third and fourth gate voltage supply lines GVSPL3 and GVSPL4 and neighboring lines thereof may become considerably small.

In order to prevent this phenomenon, in accordance with the fourth embodiment, the third gate control supply line GCSPL3 that transmits the start signal of the first gate driver GDR1, the fourth gate control supply line GCSPLA that transmits the start signal of the second gate driver GDR2, and the fifth gate control supply line GCSPL5 that transmits the start signal of the third gate driver GDR3 may be spaced apart from the second gate driver GDR2 by a large distance, so that the third and fourth gate voltage connection portions OGHCN and OGLCN and the third and fourth gate voltage supply lines GVSPL3 and GVSPL4 may be arranged with a margin width corresponding to the distance.

In this way, the resistance of each of the third gate voltage supply line GVSPL3 and the fourth gate voltage supply line GVSPL4 may be lowered while preventing a short-circuit defect.

However, the effects of the disclosure are not restricted to the ones set forth herein. The above and other effects of the disclosure will become more apparent to one of ordinary skill in the art to which the disclosure pertains by referencing the claims.

What is claimed is:

1. A display device comprising:
    a substrate comprising a display area including emission areas and a non-display area adjacent to the display area;
    a circuit layer disposed on a first surface of the substrate;
    a light emitting element layer disposed on the circuit layer and comprising light emitting elements respectively corresponding to the emission areas; and
    a circuit board disposed on a second surface of the substrate opposite to the first surface, wherein
    the circuit layer comprises:
        pixel drivers respectively corresponding to the emission areas and electrically connected to the light emitting elements of the light emitting element layer;
        gate lines extending in a first direction and transmitting gate signals to the pixel drivers;
        a first power supply line and a second power supply line disposed in the non-display area and respectively transmitting a first power and a second power that drive the light emitting elements; and
        a gate driver disposed between an edge of the substrate and at least a side in the first direction of the display area in the non-display area, and comprising stages electrically connected to the gate lines, respectively,
    the second power supply line is electrically connected to the circuit board through power connection portions, and
    in a view perpendicular to the first surface of the substrate, the power connection portions are disposed between adjacent stages among the stages of the gate driver, the adjacent stages being adjacent to each other along a curved corner of the substrate.

2. The display device of claim 1, wherein
    the gate driver comprises stage groups, which are part of the stages,
    a gap between the stage groups is greater than a gap between two or more consecutive stages, and
    in the view, the power connection portions are disposed between adjacent stage groups among the stage groups of the gate driver, the adjacent stage groups being adjacent to each other along the curved corner of the substrate.

3. The display device of claim 1, wherein the circuit layer has a structure comprising:
    a buffer layer disposed on the substrate;
    a semiconductor layer disposed on the buffer layer;
    a first gate insulating layer covering the semiconductor layer;
    a first gate conductive layer disposed on the first gate insulating layer;
    a second gate insulating layer covering the first gate conductive layer;
    a second gate conductive layer disposed on the second gate insulating layer;
    an interlayer insulating layer covering the second gate conductive layer;
    a first source-drain conductive layer disposed on the interlayer insulating layer;
    a first planarization layer covering the first source-drain conductive layer;
    a second source-drain conductive layer disposed on the first planarization layer; and
    a second planarization layer covering the second source-drain conductive layer,
    wherein the second source-drain conductive layer comprises the second power supply line.

4. The display device of claim 3, wherein the substrate comprises:
    a first support layer comprising the second surface of the substrate;
    a first barrier layer disposed on a surface of the first support layer opposite to the second surface;
    a pad conductive layer disposed on a part of the first barrier layer;
    a second barrier layer covering the pad conductive layer; and
    a second support layer disposed on the second barrier layer and comprising a surface facing the first support layer and the first surface of the substrate, wherein
    the pad conductive layer comprises signal pads electrically connected to the circuit board, and pad lines respectively electrically connected to the signal pads,
    the second power supply line is electrically connected to a second power pad line among the pad lines through the power connection portions, and
    the circuit board is electrically connected to the signal pads through a pad hole penetrating the first support layer, and is electrically connected to the second power pad line through a second power signal pad electrically connected to the second power pad line among the signal pads.

5. The display device of claim 4, wherein each of the power connection portions comprises:

a first through hole penetrating the first planarization layer;
a second through hole penetrating the interlayer insulating layer, the second gate insulating layer, the first gate insulating layer, and the buffer layer;
a third through hole penetrating the second support layer and the second barrier layer; and
a second power supply connection electrode electrically connected to the second power supply line through the first through hole, and electrically connected to the second power pad line through the second through hole and the third through hole.

6. The display device of claim 4, wherein the gate lines comprise:
   a scan write line that transmits a scan write signal to the pixel drivers;
   a scan initialization line that transmits a scan initialization signal to the pixel drivers;
   an emission control line that transmits an emission control signal to the pixel drivers; and
   a gate control line that transmits a gate control signal to the pixel drivers, wherein
   the circuit layer further comprises:
      a data line that transmits a data signal to the pixel drivers;
      an initialization voltage line that transmits an initialization voltage to the pixel drivers; and
      a first power line electrically connected between the first power supply line and the pixel drivers,
   one of the pixel drivers of the circuit layer is electrically connected to at least one of the light emitting elements of the light emitting element layer, and
   the one pixel driver comprises:
      a driving transistor that generates a driving current that drives the at least one of the light emitting elements;
      a first transistor disposed between a gate electrode of the driving transistor and a second electrode of the driving transistor, and turned on based on the scan write signal of the scan write line;
      a second transistor disposed between the data line and a first electrode of the driving transistor, and turned on based on the scan write signal of the scan write line;
      a third transistor disposed between the initialization voltage line and the gate electrode of the driving transistor, and turned on based on the scan initialization signal of the scan initialization line;
      a fourth transistor disposed between the initialization voltage line and the at least one light emitting element, and turned on based on the scan initialization signal of the scan initialization line;
      a fifth transistor disposed between the first power supply line and the first electrode of the driving transistor, and turned on based on the emission control signal of the emission control line; and
      a sixth transistor disposed between the second electrode of the driving transistor and the at least one light emitting element, and turned on based on the emission control signal of the emission control line.

7. The display device of claim 6, wherein
the gate driver comprises a first gate driver, a second gate driver, and a third gate driver disposed side by side in the first direction between a side of the display area in the first direction and the edge of the substrate,
the first gate driver comprises write stages electrically connected to the scan write line,
the second gate driver comprises initialization stages electrically connected to the scan initialization line and the gate control line, and
the third gate driver comprises emission stages electrically connected to the emission control line.

8. The display device of claim 7, wherein
the third gate driver comprises emission stage groups, which are part of the emission stages,
a gap between the emission stage groups is greater than a gap between two or more consecutive emission stages,
the second power supply line overlaps the third gate driver, and
in the view, the power connection portions are disposed between adjacent emission stage groups among the emission stage groups of the third gate driver, the adjacent emission stage groups being adjacent to each other along the curved corner of the substrate.

9. The display device of claim 8, wherein
the first gate driver comprises write stage groups, which are part of the write stages,
a gap between the write stage groups is greater than a gap between two or more consecutive write stages,
the circuit layer further comprises a power supply additional line overlapping a part of the first gate driver,
the power supply additional line is electrically connected to the second power pad line through second power additional connection portions, and
in the view, the second power additional connection portions are disposed between adjacent write stage groups among the write stage groups of the first gate driver, the adjacent write stage groups being adjacent to each other along the curved corner of the substrate.

10. The display device of claim 8, wherein
the circuit layer further comprises gate control supply lines, gate voltage supply lines, and gate clock supply lines electrically connected to the stages of the gate driver,
the gate control supply lines transmit gate driving control signals to the stages,
the gate voltage supply lines transmit gate level voltages for generating the gate signals,
the gate clock supply lines transmit clock signals for generating the gate signals,
each of the gate control supply lines, the gate voltage supply lines, and the gate clock supply lines is included in the first source-drain conductive layer or the second source-drain conductive layer, and spaced apart from the power connection portions, and
the gate voltage supply lines comprise:
   a first gate voltage supply line adjacent to or overlapping the first gate driver, and supplying a first gate level voltage;
   a second gate voltage supply line adjacent to or overlapping the first gate driver, and supplying a second gate level voltage different from the first gate level voltage;
   a third gate voltage supply line overlapping the second gate driver, and supplying a third gate level voltage different from the first gate level voltage and the second gate level voltage;
   a fourth gate voltage supply line overlapping the second gate driver, and supplying a fourth gate level voltage different from the first gate level voltage, the second gate level voltage, and the third gate level voltage; and a fifth gate voltage supply line overlapping at least a part of the fourth gate voltage supply line, and supplying the first gate level voltage, wherein the third gate voltage supply line is electrically connected to the circuit board through a third gate voltage connection portion, the fourth gate voltage supply line is electrically connected to the circuit board through a fourth gate voltage connection portion, the second gate driver comprises initialization stage groups which are part of the initialization stages, a gap between the initialization stage groups is greater than a gap between two or more consecutive initialization stages, and in the view, the third gate voltage connection portion and the fourth gate voltage connection portion are disposed between adjacent initialization stage groups among the initialization stage groups of the second gate driver, the adjacent initialization stage groups being adjacent to each other along the curved corner of the substrate.

11. The display device of claim 10, wherein the gate control supply lines comprise:
a first gate control supply line that transmits an input carry signal to the write stages of the first gate driver;
a second gate control supply line that transmits an input carry signal to the initialization stages of the second gate driver;
a third gate control supply line that transmits a start signal of the first gate driver;
a fourth gate control supply line that transmits a start signal of the second gate driver;
a fifth gate control supply line that transmits a start signal of the third gate driver;
a sixth gate control supply line that transmits a gate-on signal; and
a seventh gate control supply line that transmits an input carry signal to the emission stages of the third gate driver,
wherein, in the view, the fifth gate voltage supply line is spaced apart from each of the third gate voltage supply line and the fourth gate voltage supply line between the adjacent initialization stage groups of the second gate driver.

12. The display device of claim 11, wherein the third gate control supply line, the fourth gate control supply line, and the fifth gate control supply line overlap the second gate driver.

13. The display device of claim 11, wherein the third gate control supply line, the fourth gate control supply line, and the fifth gate control supply line overlap the first gate driver.

14. A display device comprising:
a substrate comprising a display area including emission areas and a non-display area adjacent to the display area;
a circuit layer disposed on a first surface of the substrate;
a light emitting element layer disposed on the circuit layer and comprising light emitting elements respectively corresponding to the emission areas; and
a circuit board disposed on a second surface of the substrate opposite to the first surface, wherein
the substrate comprises a first support layer and a second support layer facing each other, and a pad conductive layer disposed between the first support layer and the second support layer, and
the pad conductive layer comprises signal pads electrically connected to the circuit board, and pad lines respectively electrically connected to the signal pads,
the circuit layer comprises:
pixel drivers respectively corresponding to the emission areas and electrically connected to the light emitting elements of the light emitting element layer;
gate lines extending in a first direction and transmitting gate signals to the pixel drivers;
a first power supply line and a second power supply line disposed in the non-display area and respectively transmitting a first power and a second power that drive the light emitting elements; and
a gate driver disposed between an edge of the substrate and at least a side in the first direction of the display area in the non-display area, and comprising stages electrically connected to the gate lines, respectively,
the second power supply line is electrically connected to a second power pad line among the pad lines through power connection portions, and
in a view perpendicular to the first surface of the substrate, the power connection portions are disposed between adjacent starges among the stages of the gate driver, the adjacent stages being adjacent to each other along a curved corner of the substrate.

15. The display device of claim 14, wherein
the gate driver comprises stage groups which are part of the stages,
a gap between the stage groups is greater than a gap between two or more consecutive stages, and
the power connection portions are disposed between a number of the stage groups of the gate driver adjacent to the curved corner of the substrate.

16. The display device of claim 14, wherein
the second support layer comprises the first surface of the substrate,
the first support layer comprises the second surface of the substrate,
the substrate further comprises:
a first barrier layer disposed on a surface of the first support layer opposite to the second surface; and
a second barrier layer disposed on a surface of the second support layer opposite to the first surface,
the pad lines are disposed between the first barrier layer and the second barrier layer,
the signal pads are disposed between the second barrier layer and the first support layer, and
the circuit board is electrically connected to the signal pads through a pad hole penetrating the first support layer.

17. The display device of claim 16, wherein the circuit layer has a structure comprising:
a buffer layer disposed on the substrate;
a semiconductor layer disposed on the buffer layer;
a first gate insulating layer covering the semiconductor layer;
a first gate conductive layer disposed on the first gate insulating layer;
a second gate insulating layer covering the first gate conductive layer;
a second gate conductive layer disposed on the second gate insulating layer;
an interlayer insulating layer covering the second gate conductive layer;
a first source-drain conductive layer disposed on the interlayer insulating layer;
a first planarization layer covering the first source-drain conductive layer;
a second source-drain conductive layer disposed on the first planarization layer; and a second planarization layer covering the second source-drain conductive layer, wherein the second source-drain conductive layer comprises the second power supply line.

18. The display device of claim 17, wherein each of the power connection portions comprises:
   a first through hole penetrating the first planarization layer;
   a second through hole penetrating the interlayer insulating layer, the second gate insulating layer, the first gate insulating layer, and the buffer layer;
   a third through hole penetrating the second support layer and the second barrier layer; and
   a second power supply connection electrode electrically connected to the second power supply line through the first through hole, and electrically connected to the second power pad line through the second through hole and the third through hole.

19. The display device of claim 17, wherein the circuit layer further comprises:
   gate control supply lines, gate voltage supply lines, and gate clock supply lines electrically connected to the stages of the gate driver,
   the gate control supply lines transmit gate driving control signals to the stages,
   the gate voltage supply lines transmit level voltages of the gate signal,
   the gate clock supply lines transmit clock signals for generating the gate signal,
   the gate control supply lines, the gate voltage supply lines, and the gate clock supply lines are included in the first source-drain conductive layer or the second source-drain conductive layer, and spaced apart from the power connection portions, and
   a number of the gate control supply lines, the gate voltage supply lines, and the gate clock supply lines adjacent to the power connection portions overlap the second power supply line.

20. The display device of claim 19, wherein the gate lines comprise:
   a scan write line that transmits a scan write signal to the pixel drivers;
   a scan initialization line that transmits a scan initialization signal to the pixel drivers;
   an emission control line that transmits an emission control signal to the pixel drivers; and
   a gate control line that transmits a gate control signal to the pixel drivers, wherein the circuit layer further comprises:
      a data line that transmits a data signal to the pixel drivers;
      an initialization voltage line that transmits an initialization voltage to the pixel drivers; and
      a first power line electrically connected between the first power supply line and the pixel drivers,
   one of the pixel drivers of the circuit layer is electrically connected to at least one of the light emitting elements of the light emitting element layer,
   the one pixel driver comprises:
      a driving transistor that generates a driving current that drives the at least one light emitting element;
      a first transistor disposed between a gate electrode of the driving transistor and a second electrode of the driving transistor, and turned on based on the scan write signal of the scan write line;
      a second transistor disposed between the data line and a first electrode of the driving transistor, and turned on based on the scan write signal of the scan write line;
      a third transistor disposed between the initialization voltage line and the gate electrode of the driving transistor, and turned on based on the scan initialization signal of the scan initialization line;
      a fourth transistor disposed between the initialization voltage line and the one light emitting element, and turned on based on the scan initialization signal of the scan initialization line;
      a fifth transistor disposed between the first power supply line and the first electrode of the driving transistor, and turned on based on the emission control signal of the emission control line; and
      a sixth transistor disposed between the second electrode of the driving transistor and the one light emitting element, and turned on based on the emission control signal of the emission control line.

21. The display device of claim 20, wherein
the gate driver comprises a first gate driver, a second gate driver, and a third gate driver disposed side by side in the first direction between a side of the display area in the first direction and the edge of the substrate,
the first gate driver comprises write stages electrically connected to the scan write line,
the second gate driver comprises initialization stages electrically connected to the scan initialization line and the gate control line, and
the third gate driver comprises emission stages electrically connected to the emission control line.

22. The display device of claim 21, wherein
the third gate driver comprises emission stage groups which are part of the emission stages,
a gap between the emission stage groups is greater than a gap between two or more consecutive emission stages,
the second power supply line overlaps the third gate driver, and
the power connection portions are disposed between a number of the emission stage groups of the third gate driver adjacent to the curved corner of the substrate.

23. The display device of claim 22, wherein
the circuit layer further comprises gate control supply lines, gate voltage supply lines, and gate clock supply lines electrically connected to the stages of the gate driver,
the gate control supply lines transmit gate driving control signals to the stages,
the gate voltage supply lines transmit level voltages of the gate signal, and
the gate clock supply lines transmit clock signals for generating the gate signal,
wherein the gate control supply lines comprise:
   a first gate control supply line that transmits an input carry signal to the write stages of the first gate driver;
   a second gate control supply line that transmits an input carry signal to the initialization stages of the second gate driver;
   a third gate control supply line that transmits a start signal of the first gate driver;
   a fourth gate control supply line that transmits a start signal of the second gate driver;
   a fifth gate control supply line that transmits a start signal of the third gate driver;

a sixth gate control supply line that transmits a gate-on signal to the second gate driver and the third gate driver; and a seventh gate control supply line that transmits an input carry signal to the emission stages of the third gate driver.

24. The display device of claim 23, wherein the first gate driver comprises write stage groups which are part of the write stages, a gap between the write stage groups is greater than a gap between two or more consecutive write stages, the circuit layer further comprises a power supply additional line electrically connected to the second power pad line through second power additional connection portions, the third gate control supply line, the fourth gate control supply line, and the fifth gate control supply line overlap the second gate driver, and the second power additional connection portions are disposed between a number of the write stage groups of the first gate driver adjacent to the curved corner of the substrate.

25. The display device of claim 23, wherein the gate voltage supply lines comprise:

a first gate voltage supply line adjacent to or overlapping the first gate driver, and supplying a first gate level voltage;

a second gate voltage supply line adjacent to or overlapping the first gate driver, and supplying a second gate level voltage different from the first gate level voltage;

a third gate voltage supply line overlapping the second gate driver, and supplying a third gate level voltage different from the first gate level voltage and the second gate level voltage;

a fourth gate voltage supply line overlapping the second gate driver, and supplying a fourth gate level voltage different from the first gate level voltage, the second gate level voltage, and the third gate level voltage; and a fifth gate voltage supply line overlapping at least a part of the fourth gate voltage supply line, and supplying the first gate level voltage, wherein the third gate voltage supply line is electrically connected to the circuit board through a third gate voltage connection portion, the fourth gate voltage supply line is electrically connected to the circuit board through a fourth gate voltage connection portion, the second gate driver comprises initialization stage groups which are part of the initialization stages, a gap between the initialization stage groups is greater than a gap between two or more consecutive initialization stages, and the third gate voltage connection portion and the fourth gate voltage connection portion are disposed between a number of the initialization stage groups of the second gate driver adjacent to the curved corner of the substrate.

26. The display device of claim 25, wherein the third gate control supply line, the fourth gate control supply line, and the fifth gate control supply line overlap the second gate driver.

27. The display device of claim 25, wherein the third gate control supply line, the fourth gate control supply line, and the fifth gate control supply line overlap the first gate driver.

* * * * *